(12) United States Patent
Chann et al.

(10) Patent No.: US 8,724,222 B2
(45) Date of Patent: May 13, 2014

(54) COMPACT INTERDEPENDENT OPTICAL ELEMENT WAVELENGTH BEAM COMBINING LASER SYSTEM AND METHOD

(75) Inventors: Bien Chann, Merrimack, NH (US); Robin Huang, North Billerica, MA (US)

(73) Assignee: Teradiode, Inc., Wilmington, MA (US)

( * ) Notice: Subject to any disclaimer, the term of this patent is extended or adjusted under 35 U.S.C. 154(b) by 217 days.

(21) Appl. No.: 13/286,027

(22) Filed: Oct. 31, 2011

(65) Prior Publication Data

US 2012/0105968 A1     May 3, 2012

Related U.S. Application Data

(63) Continuation of application No. 13/042,042, filed on Mar. 7, 2011, now Pat. No. 8,553,327.

(60) Provisional application No. 61/408,645, filed on Oct. 31, 2010.

(51) Int. Cl.
    *G02B 27/10*        (2006.01)

(52) U.S. Cl.
    USPC .................. 359/621; 359/341.1; 359/556

(58) Field of Classification Search
    USPC ...................... 359/621, 341.1, 556
    See application file for complete search history.

(56) References Cited

U.S. PATENT DOCUMENTS

2007/0127123 A1*   6/2007   Brown et al. .............. 359/556

* cited by examiner

*Primary Examiner* — James Jones
(74) *Attorney, Agent, or Firm* — Ascentage Law, PLLC; Travis L. Johnson

(57) ABSTRACT

A Compact Interdependent Optical Laser System and Method is designed for use with wavelength beam combining (WBC) systems that utilize both slow-axis and fast-axis WBC. Multiple optical elements having individual and interdependent functionality allow for the system to compact reducing the overall footprint of the system. Additional, configurations incorporating the compact system described herein allow for high-power and brightness scaling.

14 Claims, 20 Drawing Sheets

COMPACT INTERDEPENDENT OPTICAL ELEMENT WAVELENGTH BEAM COMBINING LASER SYSTEM AND METHOD

CROSS-REFERENCE TO RELATED APPLICATIONS

This application claims priority under 35 U.S.C. §119 to the following U.S. Provisional Patent Applications, each of which is hereby incorporated by reference in its entirety: U.S. Ser. No. 61/408,645 filed Oct. 31, 2010. This application is also a continuation in part of U.S. 13/042,042 filed Mar. 7, 2011.

BACKGROUND OF THE INVENTION

1. Field of the Invention

The present embodiments relate generally to laser systems and more particularly to laser system modules that may be combined to scale output power.

2. Description of the Prior Art

Wavelength beam combining (WBC) is a method for scaling the output power and brightness from laser diode bars, stacks of diode bars, as well as other lasers arranged in one or two-dimensional arrays.

WBC methods have been developed to combine beams along the slow dimension of each emitter as well as the fast dimension of each emitter. See for example, U.S. Pat. Nos. 6,192,062, 6,208,679 and 2010/0110556 A1. In prior patents, U.S. Pat. Nos. 6,192,062 and 6,208,679, beam combining is performed along the array dimension. These arrays and stacks may be increased to produce several kilowatts of power. However, as with most high power systems, thermal management throughout the laser system often becomes more complex, increases the footprint of the system, and drives the overall cost up with increased power output. One factor includes the need to use specially manufactured optical coatings, lenses, and reflective mirrors to handle the increase in power, which in turn drives the cost of the system up. Therefore, what is desired is a laser system where thermal management is less complex, system cost is lower, system footprint is smaller, capability of combining with other systems for power scalability, and a replaceable module.

The following application seeks to solve the problems stated.

SUMMARY OF THE INVENTION

A laser system comprising: a plurality of electromagnetic radiation sources each configured to produce a unique wavelength emission beam; a first and second optical element configured to collectively reduce the image size of the array of emission beams along a first dimension; a third optical element configured to receive the reduced-in-image size emission beams and overlap the beams along the first dimension; a dispersive element positioned at a region of overlap to receive and transmit the overlapped beams as a multi-wavelength beam; and a partially-reflective output coupler arranged to receive the multi-wavelength beam, to reflect a portion of the multi-wavelength beam back to the dispersive element, and to transmit the multi-wavelength beam, wherein the first and third optical elements collectively are configured to image the array of emission beams along a second dimension.

These interdependent optical elements allow for a smaller footprint laser system, that in turn allows for a simpler thermal management system, and can be readily scalable, and in-field replaceable with minimal specialty training.

DETAILED DESCRIPTION OF THE PREFERRED EMBODIMENT

Aspects and embodiments relate generally to the field of scaling laser sources to high-power and high-brightness using an external cavity and, more particularly, to methods and apparatus for external-cavity beam combining using both one-dimensional or two-dimensional laser sources. In one embodiment the external cavity system includes one-dimensional or two-dimensional laser elements, an optical system, a dispersive element, and a partially reflecting element. An optical system is one or more optical elements that perform two basic functions. The first function is to overlap all the laser elements along the beam combining dimension onto a dispersive element. The second function is to make sure all the elements along the non beam combining dimension are propagating normal to the output coupler. Care must be taken to ensure that the optical system introduces as little loss as possible. As such, these two functions will enable a single resonance cavity for all the laser elements. In another embodiment the WBC external cavity system includes wavelength stabilized one-dimensional or two-dimensional laser elements, an optical system, and a dispersive element. One-dimensional or two-dimensional wavelength stabilized laser elements, with unique wavelength, can be accomplished using various means such as laser elements with feedback from wavelength chirped Volume Bragg grating, distributed feedback (DFB) laser elements, or distributed Bragg reflector (DBR) laser elements. Here the main function of the optical system is to overlap all the beams onto a dispersive element. Since there is no output coupler mirror external to the wavelength-stabilized laser element, having parallel beams along the non beam-combining dimension is less important. Aspects and embodiments further relate to high-power and/or high-brightness multi-wavelength external-cavity lasers that generate an overlapping or coaxial beam from very low output power to hundreds and even to megawatts of output power.

In particular, aspects and embodiments are directed to a method and apparatus for manipulating the beams emitted by the laser elements of these external-cavity systems and combining them using a WBC method to produce a desired output profile. Wavelength beam combining methods have been developed to combine asymmetrical beam elements across their respective slow or fast axis dimension. One advantage this invention seeks to provide is the ability to selectively-reconfigure input beams either spatially or by orientation to be used in slow and fast axis WBC methods, as well as a hybrid of the two. Another advantage is to selectively-reconfigure input beams when there is a fixed-position relationship to other input beams. A third advantage is to produce a compact WBC laser system.

Figure 1A:
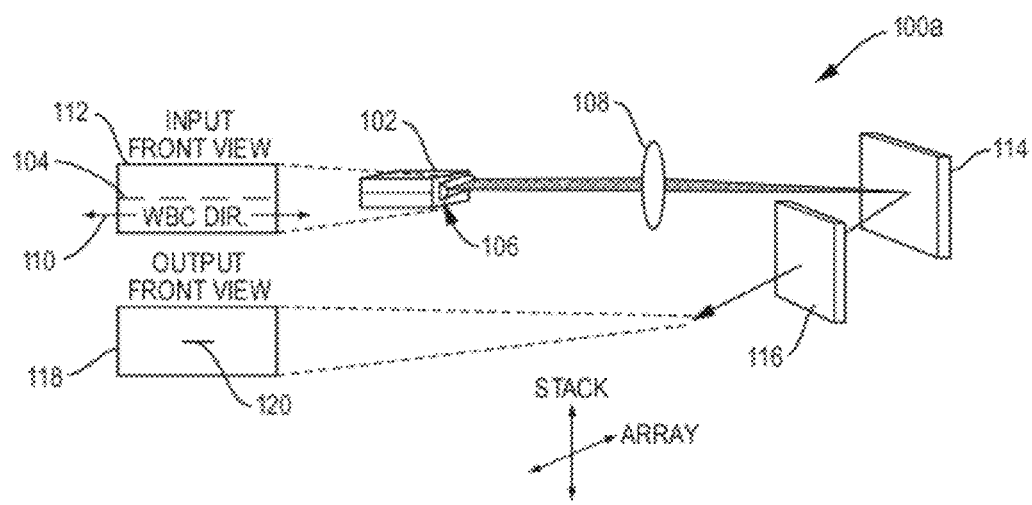
FIG. 1A is a schematic of a one-dimensional (1-D) wavelength beam combining (WBC) method along the array dimension of a single row of emitters.

FIG. 1A illustrates a basic WBC architecture. This is the basis of U.S. Pat. Nos. 6,192,062, 6,208,679. In this particular illustration, WBC is performed along the array dimension or slow dimension for broad-area emitters. Individual beams 104 are illustrated in the figures by a dash or single line, where the length or longer dimension of the beam represents the array dimension or slow diverging dimension for broad-area emitters and the height or shorter dimension represents the fast diverging dimension. (See also left side of FIG. 8). In this related art, a diode bar 102 having four emitters is illustrated. The emitters are aligned in a manner such that the slow dimension ends of each emitted beam 104 are aligned to one another side by side along a single row—sometimes referred to as an array. However, it is contemplated that any lasing elements may be used and in particular laser elements with broad gain bandwidth. Typically a collimation lens 106 is used to collimate each beam along the fast diverging dimension. In some cases the collimation optics can be composed of separate fast axis collimation lenses and slow axis collimation lenses. Typically, transform optic 108 is used to combine each beam along the WBC dimension 110 as shown by the input front view 112. Transform optic 108 may be a cylindrical or spherical lens or mirror. The transform optic 108 then overlaps the combined beam onto a dispersive element 114 (here shown as a reflecting diffraction grating). The first-order diffracted beams are incident onto a partially reflecting mirror. The laser resonator is formed between the back facet of the laser elements and the partially reflecting mirror if the front facet of the elements is zero. If the front facet of the elements is finite (not zero), then the laser resonator can be thought as forming between the back facet and an effective coupler having an effective reflectivity that is a function of the front facet and output coupler reflectivity. As such, the combined beam is then transmitted as a single output profile onto an output coupler 116. This output coupler then transmits the combined beams 120, as shown by the output front view 118. It is contemplated creating a system devoid of an output coupler. For instance, a one-dimensional or two-dimensional system with wavelength stabilized laser elements and each having a unique wavelength can be accomplished a few ways. One system or method uses laser elements with feedback from an external wavelength chirped Volume Bragg grating along the beam combining dimension. Another uses internal distributed feedback (DFB) laser elements or internal distributed Bragg reflector (DBR) laser elements. In these systems, the single output profile transmitted from the dispersive element would have the same profile as 118. The output coupler 116 may be a partially reflective mirror or surface or optical coating and act as a common reflector for all the laser elements in diode array 102. A portion of the emitted beams is reflected back into the optical gain and/or lasing portion of diode array 102 in this external cavity system 100*a*. An external cavity is a lasing system where the secondary mirror is displaced at a distance away from the emission aperture or facet (not labeled) of each laser emitter. Generally, in an external cavity additional optical elements are placed between the emission aperture or facet and the output coupler or partially reflective surface.

Figure 1B:
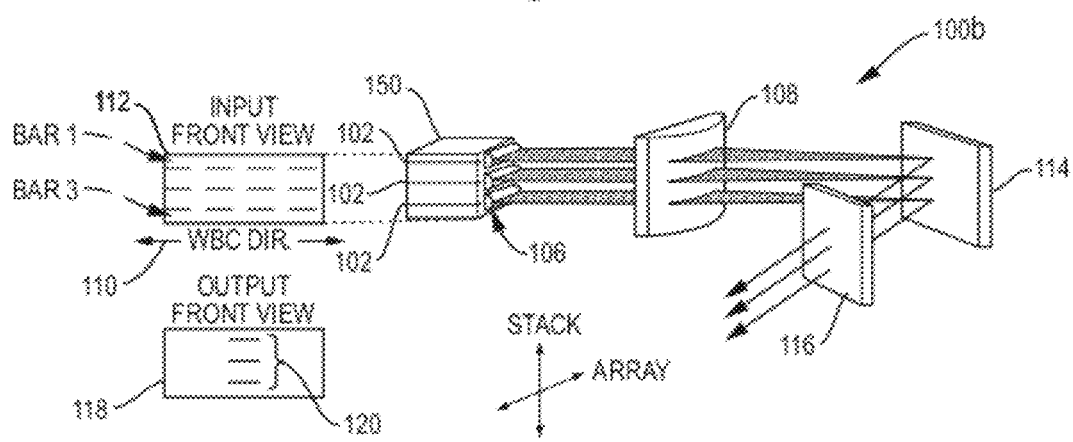
FIG. 1B is a schematic of a 1-D WBC method along the array dimension of a two-dimensional array of emitters.

Similarly, FIG. 1B illustrates a stack of laser diode bars each having four emitters where those bars are stacked three high. (See also left side of FIG. 8.) Like FIG. 1A, the input front view 112 of FIG. 1B, which in this embodiment is a two-dimensional array of emitters, is combined to produce the output front view 118 or a single column of emitters 120. The emitted beams in external cavity 100*b* were combined along the array dimension. Here transform optic 108 is a cylindrical lens used to combine the beams along the array. However, a combination of optical elements or optical system can be used as such that the optical elements arrange for all the beams to overlap onto the dispersive element and make sure all the beams along the non-beam-combining dimension are propagating normal to the output coupler. A simple example of such an optical system would be a single cylindrical lens with the appropriate focal length along the beam-combining dimension and two cylindrical lenses that form an afocal telescope along the non beam-combining dimension wherein the optical system projects images onto the partially reflecting mirrors. Many variations of this optical system can be designed to accomplish the same functions.

The array dimension FIG. 1B is also the same axis as the slow dimension of each emitted beam in the case of multimode diode laser emitters. Thus, this WBC system may also be called slow axis combining, where the combining dimension is the same dimension of the beams.

Figure 1C:
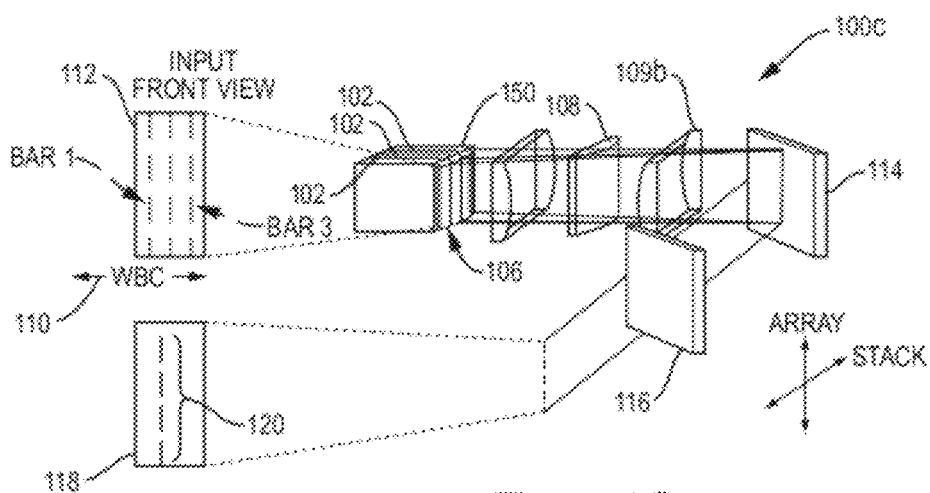
FIG. 1C is a schematic of a 1-D WBC method along the stack dimension of a two-dimensional array of emitters.

By contrast, FIG. 1C illustrates a stack 150 of laser diode arrays 102 forming a two-dimensional array of emitters, as shown by 120, where instead of combining along the array dimension as in FIGS. 1A-B, the WBC dimension now follows along the stack dimension of the emitters. Here, the stacking dimension is also aligned with the fast axis dimension of each of the emitted beams. The input front view 112 is now combined to produce the output front view 118 wherein a single column 120 of emitters is shown.

There are various drawbacks to all three configurations. One of the main drawbacks of configuration shown in FIGS. 1A and 1B is that beam combining is performed along the array dimension. As such external-cavity operation is highly dependent on imperfections of the diode array. If broad-area semiconductor laser emitters are used the spectral utilization in the WBC system is not as efficient as if beam combining is performed along the fast axis dimension. One of the main drawbacks of configurations shown in FIG. 1C is that external beam shaping for beam symmetrization is required for efficient coupling into a fiber. The beam symmetrization optics needed for a high power system having a large number of emitters may be complex and non-trivial. Another disadvantage of configuration 1C is that the output beam quality is limited to that of a single laser bar. Typical semiconductor or diode laser bars have 19 to 49 emitters per bar with nearly diffraction-limited beam quality in one dimension and beam quality that is several hundreds of times diffraction-limited along the array dimension. After beam symmetrization the output beam 120 can be coupled into at best a 100 μm/0.22 Numerical Aperture (NA) fiber. To obtain higher beam quality a small number of emitter bars is needed. For example to couple into 50 μm/0.22 NA fiber a five-emitter output beam is needed. In many industrial laser applications a higher brightness laser beam is required. For example, in some applications a two-emitter output beam is needed instead of 19 or 49. The two-emitter output beam can be coupled to a smaller core diameter fiber with much more engineering tolerance and margin. This additional margin in core diameter and NA is critical for reliable operation at high power (kW-class) power levels. While it is possible to procure five-emitter or two-emitter bars the cost and complexity is generally much higher as compare to a standard 19 or 49 emitter bars because of the significantly reduced power per bar. In this disclosure, we disclose methods to remove all of the above short comings.

The previous illustrations, FIGS. 1A-C, showed pre-arranged or fixed position arrays and stacks of laser emitters. Generally, arrays or stacks are arranged mechanically or optically to produce a particular one-dimensional or two-dimensional profile. Thus, fixed-position is used to describe a preset condition of laser elements where the laser elements are mechanically fixed with respect to each other as in the case of semiconductor or diode laser bars having multiple emitters or fiber lasers mechanically spaced apart in V-grooves, as well as other laser emitters that come packaged with the emitters in a fixed position. Alternatively, fixed position may refer to the secured placement of a laser emitter in a WBC system where the laser emitter is immobile. Pre-arranged refers to an optical array or profile that is used as the input profile of a WBC system. Often times the pre-arranged position is a result of emitters configured in a mechanically fixed position. Pre-arranged and fixed position may also be used interchangeably. Examples of fixed-position or pre-arranged optical systems are shown in FIGS. 5A-C.

Figure 5A:
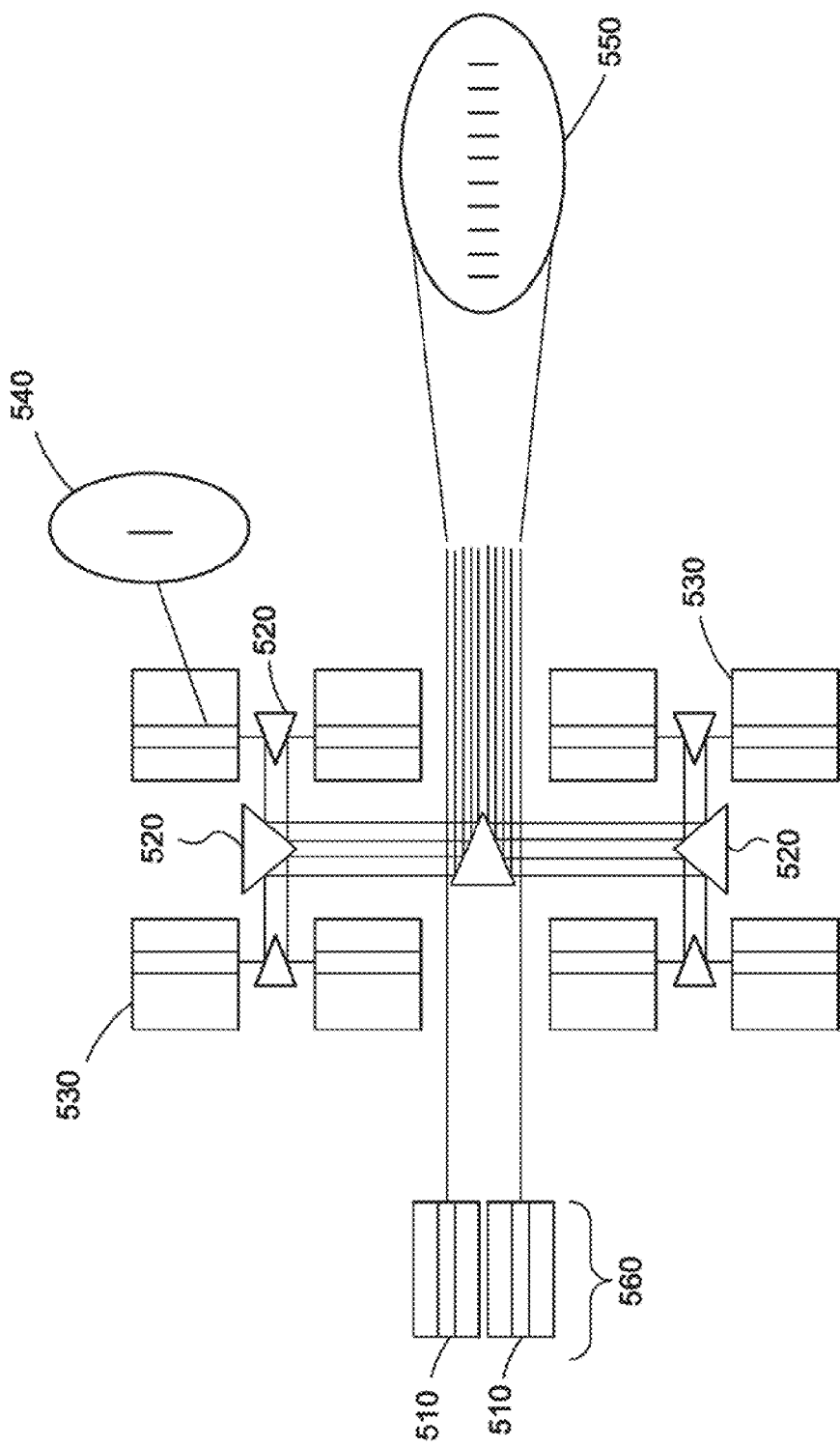
FIGS. 5A-C illustrate related methods for placing combining elements to generate one-dimensional or two-dimensional laser elements
Figure 5B:
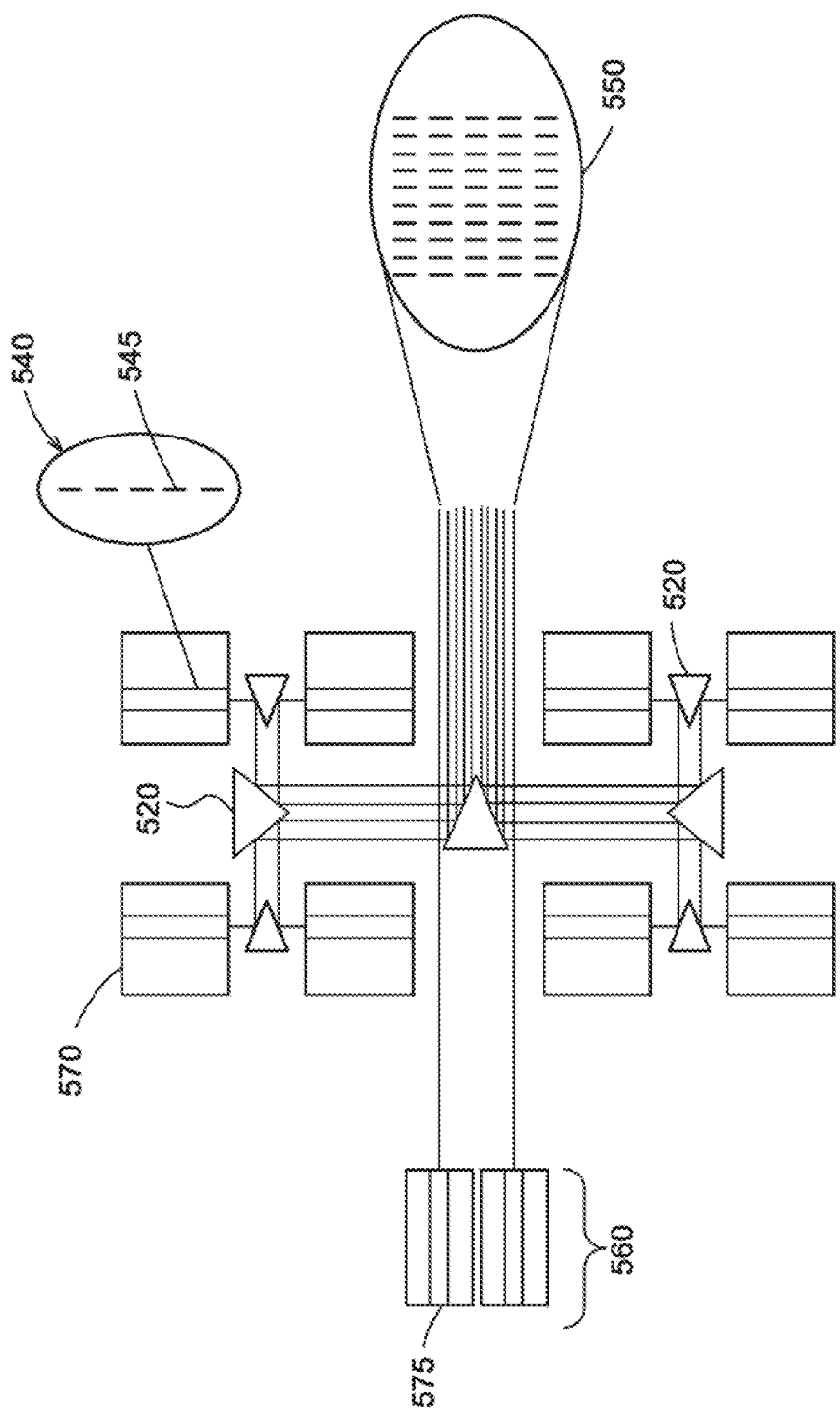
Figure 5C:
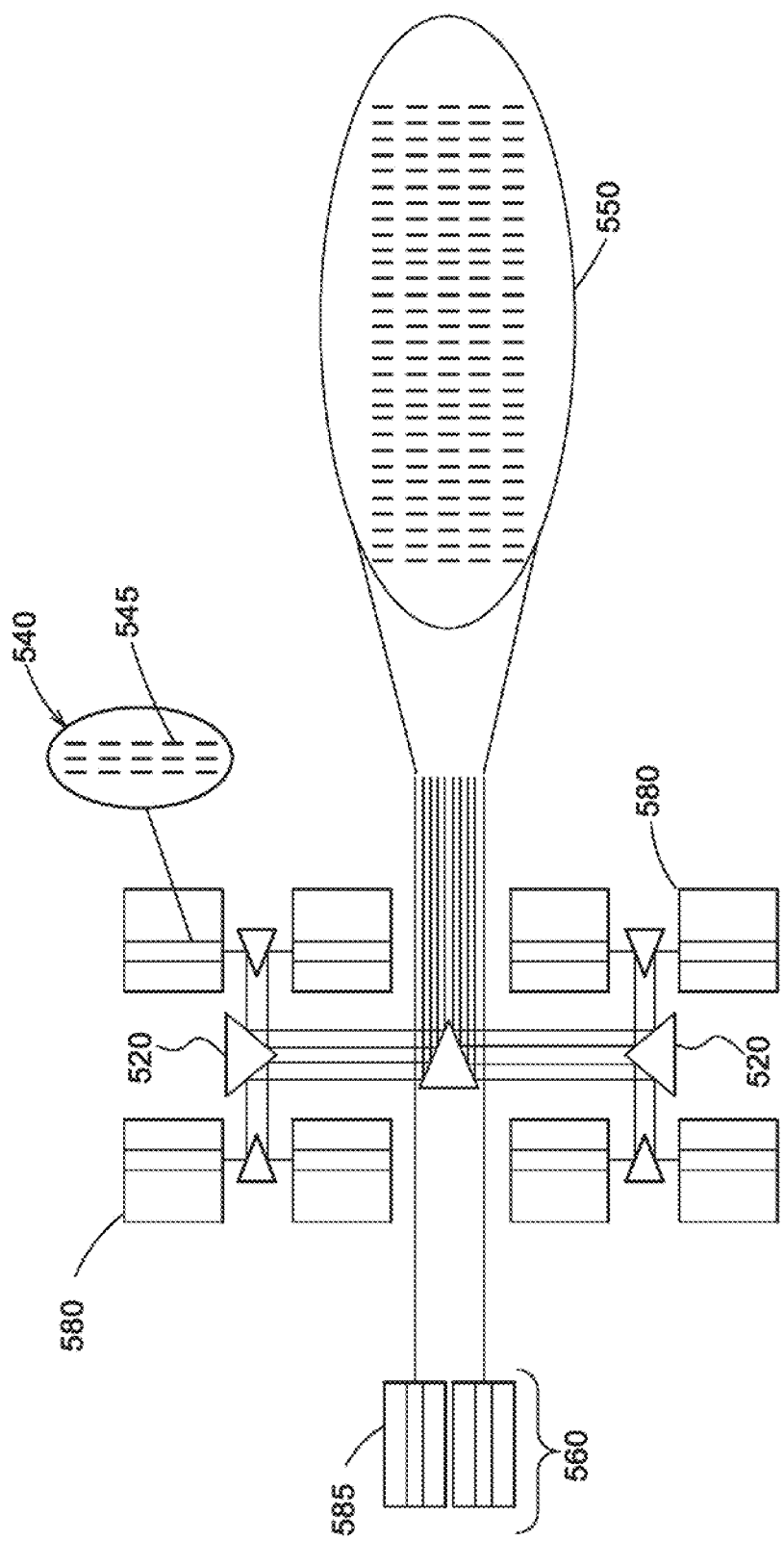

FIGS. 5A-5C refer to prior art illustrated examples of optically arranged one and two-dimensional arrays. FIG. 5A illustrates an optically arranged stack of individual optical elements 510. Mirrors 520 are used to arrange the optical beams from optical elements 530, each optical element 530 having a near field image 540, to produce an image 550 (which includes optical beams from each optical element 530) corresponding to a stack 560 (in the horizontal dimension) of the individual optical elements 510. Although the optical elements 500 may not be arranged in a stack, the mirrors 520 arrange the optical beams such that the image 550 appears to correspond to the stack 560 of optical elements 510. Similarly, in FIG. 5B, the mirrors 520 can be used to arrange optical beams from diode bars or arrays 570 to create an image 550 corresponding to a stack 560 of diode bars or arrays 575. In this example, each diode bar or array 570 has a near field image 540 that includes optical beams 545 from each individual element in the bar or array. Similarly, the mirrors 520 may also be used to optically arrange laser stacks 580 into an apparent larger overall stack 560 of individual stacks 585 corresponding to image 550, as shown in FIG. 5C.

Nomenclature, used in prior art to define the term "array dimension," referred to one or more laser elements placed side by side where the array dimension is also along the slow axis. One reason for this nomenclature is diode bars with multiple emitters are often arranged in this manner where each emitter is aligned side by side such that each beam's slow dimension is along a row or array. For purposes of this application, an array or row generally refers to individual emitters or beams arranged across a single dimension; however, an array may also be multiple rows or a two-dimensional grouping of beams or emitters. The individual slow or fast dimension of the emitters of the array may also be aligned along the array dimension, but this alignment is not to be assumed. This is important because some embodiments described herein individually rotate the slow dimension of each beam aligned along an array or row. Additionally, the slow axis of a beam refers to the wider dimension of the beam and is typically also the slowest diverging dimension, while the fast axis refers to the narrower dimension of the beam and is typically the fastest diverging dimension. The slow axis may also refer to single mode beams Additionally, some prior art defines the term "stack or stacking dimension" referred to as two or more arrays stacked together, where the beams' fast dimension is the same as the stacking dimension. These stacks were pre-arranged mechanically or optically. However, for purposes of this application a stack refers to a column of beams or laser elements and may or may not be along the fast dimension. Particularly, as discussed above, individual beams or elements may be rotated within a stack or column.

In some embodiments it is useful to note that the array dimension and the slow dimension of each emitted beam are initially oriented across the same axis; however, those dimensions, as described in this application, may become oriented at an offset angle with respect to each other. In other embodiments, the array dimension and only a portion of the emitters arranged along the array or perfectly aligned the same axis at a certain position in a WBC system. For example, the array dimension of a diode bar may have emitters arranged along the array dimension, but because of smile (often a deformation or bowing of the bar) individual emitters' slow emitting dimension is slightly skewed or offset from the array dimension.

Laser sources based on common "commercial, off-the-shelf" or COTS high power laser diode arrays and stacks are based on broad-area semiconductor or diode laser elements. Typically, the beam quality of these elements is diffraction-limited along the fast axis and many times diffraction-limited along the slow axis of the laser elements. It is to be appreciated that although the following discussion may refer primarily to single emitter laser diodes, diode laser bars and diode laser stacks, embodiments of the invention are not limited to semiconductor or laser diodes and may be used with many different types of laser and amplifier emitters, including fiber lasers and amplifiers, individually packaged diode lasers, other types of semiconductor lasers including quantum cascade lasers (QCLs), tapered lasers, ridge waveguide (RWG)

lasers, distributed feedback (DFB) lasers, distributed Bragg reflector (DBR) lasers, grating coupled surface emitting laser, vertical cavity surface emitting laser (VCSEL), and other types of lasers and amplifiers.

All of the embodiments described herein can be applied to WBC of diode laser single emitters, bars, and stacks, and arrays of such emitters. In those embodiments employing stacking of diode laser elements, mechanical stacking or optical stacking approaches can be employed. In addition, where an HR coating is indicated at the facet of a diode laser element, the HR coating can be replaced by an AR coating, provided that external cavity optical components, including but not limited to a collimating optic and bulk HR mirror are used in combination with the AR coating. This approach is used, for example, with WBC of diode amplifier elements. Slow axis is also defined as the worse beam quality direction of the laser emission. The slow axis typically corresponds to the direction parallel to the semiconductor chip at the plane of the emission aperture of the diode laser element. Fast axis is defined as the better beam quality direction of the laser emission. Fast axis typically corresponds to the direction perpendicular to the semiconductor chip at the plane of the emission aperture of the diode laser element.

Figure 10:
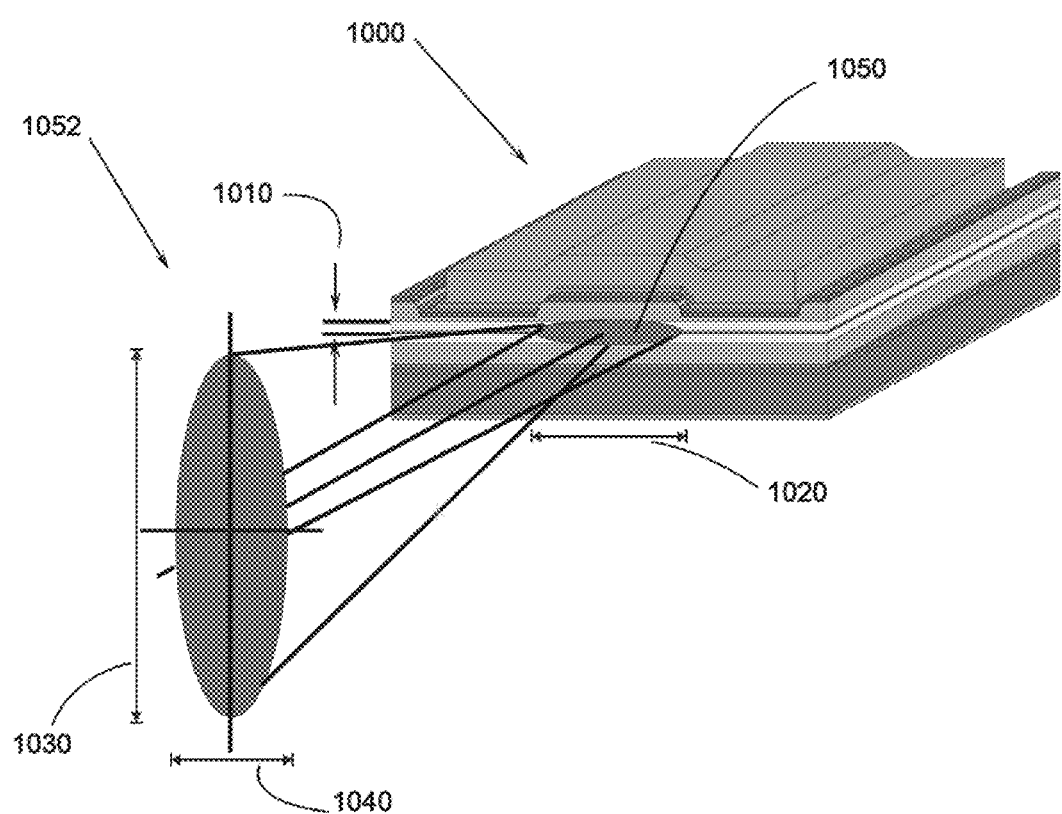
FIG. 10 is illustrative of a single semiconductor chip emitter.

An example of a single semiconductor chip emitter 1000 is shown in FIG. 10. The aperture 1050 is also indicative of the initial beam profile. Here, the height 1010 at 1050 is measured along the stack dimension. Width 1020 at 1050 is measured along the array dimension. Height 1010 is the shorter dimension at 1050 than width 1020. However, height 1010 expands faster or diverges to beam profile 1052, which is placed at a distance away from the initial aperture 1050. Thus, the fast axis is along the stack dimension. Width 1020 which expands or diverges at a slower rate as indicated by width 1040 being a smaller dimension than height 1030. Thus, the slow axis of the beam profile is along the array dimension. Though not shown, multiple single emitters such as 1000 may be arranged in a bar side by side along the array dimension.

Figure 2:
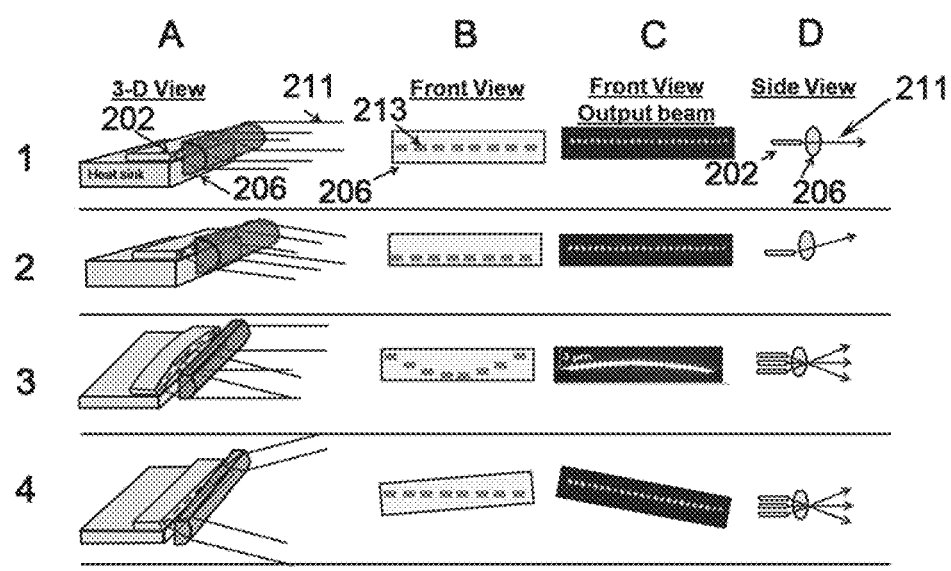
FIG. 2 is a schematic showing the effects of smile in a WBC method along the stack dimension of a two-dimensional array of diode laser emitters.

Drawbacks for combining beams primarily along their slow axis dimension may include: reduced power and brightness due to lasing inefficiencies caused by pointing errors, smile and other misalignments. As illustrated in FIG. 2, a laser diode array with smile, one often caused by the diode array being bowed in the middle sometimes caused by the diode laser bar mounting process, is one where the individual emitters along the array form a typical curvature representative of that of a smile. Pointing errors are individual emitters along the diode bar emitting beams at an angle other than normal from the emission point. Pointing error may be related to smile, for example, the effect of variable pointing along the bar direction of a diode laser bar with smile when the bar is lensed by a horizontal fast axis collimating lens. These errors cause feedback from the external cavity, which consists of the transform lens, grating, and output coupler, not to couple back to the diode laser elements. Some negative effects of this mis-coupling are that the WBC laser breaks wavelength lock and the diode laser or related packaging may be damaged from mis-coupled or misaligned feedback not re-entering the optical gain medium. For instance the feedback may hit some epoxy or solder in contact or in close proximity to a diode bar and cause the diode bar to fail catastrophically.

Row 1 of FIG. 2 shows a single laser diode bar 202 without any errors. The embodiments illustrated are exemplary of a diode bar mounted on a heat sink and collimated by a fast-axis collimation optic 206. Column A shows a perspective or 3-D view of the trajectory of the output beams 211 going through the collimation optic 206. Column D shows a side view of the trajectory of the emitted beams 211 passing through the collimation optic 206. Column B shows the front view of the laser facet with each individual laser element 213 with respect to the collimation optic 206. As illustrated in row 1, the laser elements 213 are perfectly straight. Additionally, the collimation optic 206 is centered with respect to all the laser elements 213. Column C shows the expected output beam from a system with this kind of input. Row 2 illustrates a diode laser array with pointing error. Shown by column B of row 2 the laser elements and collimation optic are slightly offset from each other. The result, as illustrated, is the emitted beams having an undesired trajectory that may result in reduced lasing efficiency for an external cavity. Additionally, the output profile may be offset to render the system ineffective or cause additional modifications. Row 3 shows an array with packaging error. The laser elements no longer sit on a straight line, and there is curvature of the bar. This is sometimes referred to as 'smile.' As shown on row 3, smile can introduce even more trajectory problems as there is no uniform path or direction common to the system. Column D of row 3 further illustrates beams 211 exiting at various angles. Row 4 illustrates a collimation lens unaligned with the laser elements in a twisted or angled manner. The result is probably the worst of all as the output beams generally have the most collimation or twisting errors. In most systems, the actual error in diode arrays and stacks is a combination of the errors in rows 2, 3, and 4. In both methods 2 and 3, using VBG's and diffraction gratings, laser elements with imperfections result in output beams no longer pointing parallel to the optical axis. These off optical axis beams result in each of the laser elements lasing at different wavelengths. The plurality of different wavelengths increases the output spectrum of the system to become broad as mentioned above.

One of the advantages of performing WBC along the stacking dimension (here also primarily the fast dimension) of a stack of diode laser bars is that it compensates for smile as shown in FIG. 2. Pointing and other alignment errors are not compensated by performing WBC along the array dimension (also primarily slow dimension). A diode bar array may have a range of emitters typically from 19 to 49 or more. As noted, diode bar arrays are typically formed such that the array dimension is where each emitter's slow dimension is aligned side by side with the other emitters. As a result, when using WBC along the array dimension, whether a diode bar array has 19 or 49 emitters (or any other number of emitters), the result is that of a single emitter. By contrast, when performing WBC along the orthogonal or fast dimension of the same single diode bar array, the result is each emitted beam increases in spectral brightness, or narrowed spectral bandwidth, but there is not a reduction in the number of beams (equivalently, there is not an increase in spatial brightness).

Figure 8:
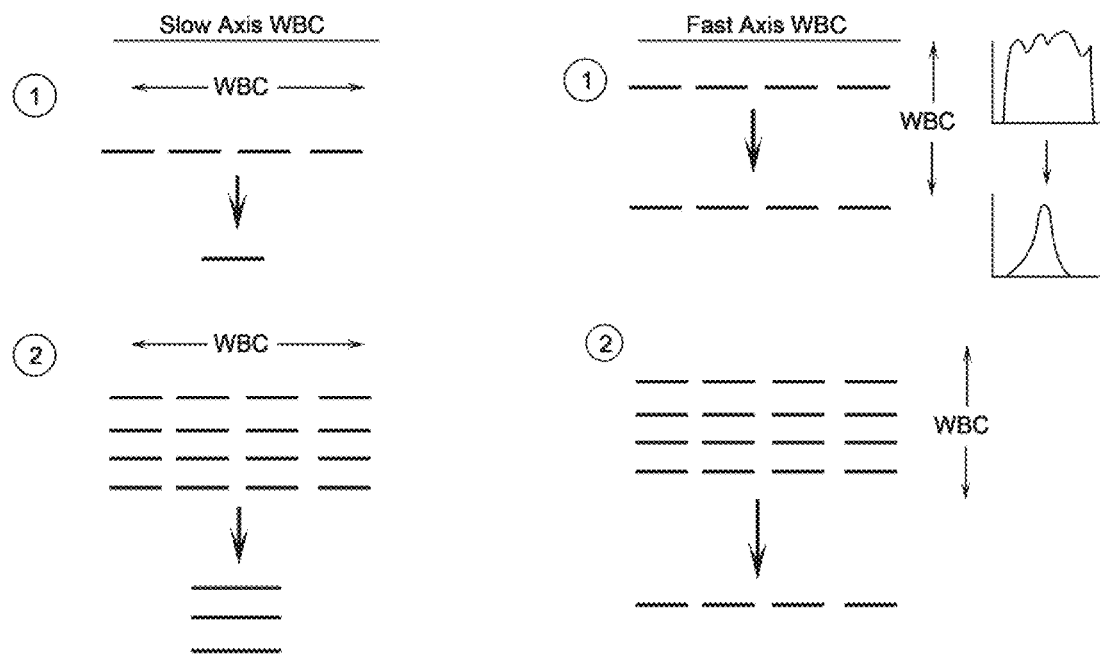
FIG. 8 illustrates the difference between slow and fast WBC.

This point is illustrated in FIG. 8. On the left of FIG. 8 is shown a front view of an array of emitters 1 and 2 where WBC along the slow dimension is being performed. Along the right side using the same arrays 1 and 2, WBC along the fast dimension is being performed. When comparing array 1, WBC along the slow dimension reduces the output profile to that of a single beam, while WBC along the fast dimension narrows the spectral bandwidth, as shown along the right side array 1, but does not reduce the output profile size to that of a single beam.

Using COTS diode bars and stacks the output beam from beam combining along the stack dimension is usually highly asymmetric. Symmetrization, or reducing the beam profile ratio closer to equaling one, of the beam profile is important when trying to couple the resultant output beam profile into an optical fiber. Many of the applications of combining a plurality of laser emitters require fiber coupling at some point in an expanded system. Thus, having greater control over the output profile is another advantage of the application.

Further analyzing array 2 in FIG. 8 shows the limitation of the number of emitters per laser diode array that is practical for performing WBC along the fast dimension if very high brightness symmetrization of the output profile is desired. As discussed above, typically the emitters in a laser diode bar are aligned side by side along their slow dimension. Each additional laser element in a diode bar is going to increase the asymmetry in the output beam profile. When performing WBC along the fast dimension, even if a number of laser diode bars are stacked on each other, the resultant output profile will still be that of a single laser diode bar. For example if one uses a COTS 19-emitter diode laser bar, the best that one can expect is to couple the output into a 100 µm/0.22 NA fiber. Thus, to couple into a smaller core fiber lower number of emitters per bar is required. One could simply fix the number of emitters in the laser diode array to 5 emitters in order to help with the symmetrization ratio; however, fewer emitters per laser diode bar array generally results in an increase of cost of per bar or cost per Watt of output power. For instance, the cost of diode bar having 5 emitters may be around $2,000 whereas the cost of diode bar having 49 emitters may be around roughly the same price. However, the 49 emitter bar may have a total power output of up to an order-of-magnitude greater than that of the 5 emitter bar. Thus, it would be advantageous for a WBC system to be able to achieve a very high brightness output beams using COTS diode bars and stacks with larger number of emitters. An additional advantage of bars with larger number of emitters is the ability to de-rate the power per emitter to achieve a certain power level per bar for a given fiber-coupled power level, thereby increasing the diode laser bar lifetime or bar reliability.

Figure 3A:
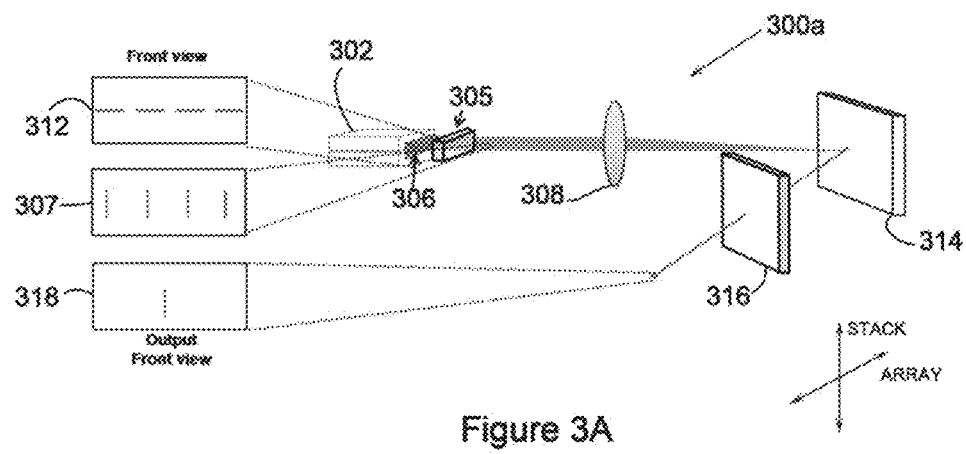
FIG. 3A is a schematic of a 1-D WBC system including an optical rotator selectively rotating a one-dimensional array of beams.
Figure 3B:
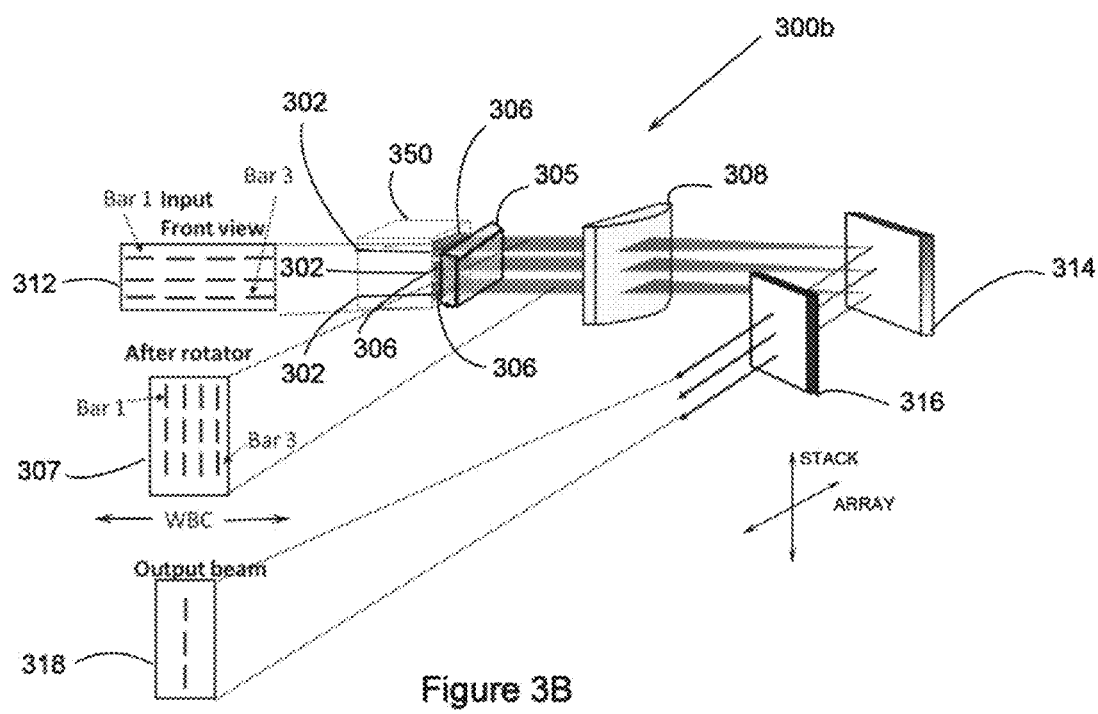
FIG. 3B is a schematic of a 1-D WBC system including an optical rotator selectively rotating a two-dimensional array of beams

One embodiment that addresses this issue is illustrated in FIG. 3A, which shows a schematic of WBC system 300a with an optical rotator 305 placed after collimation lenses 306 and before the transform optic 308. It should be noted the transform optic 308 may be comprised of a number of lenses or mirrors or other optical components. The optical rotator 305 individually rotates the fast and slow dimension of each emitted beam shown in the input front view 312 to produce the re-oriented front view 307. It should be noted that the optical rotators can selectively rotate each beam individually irrespective of the other beams or can rotate all the beams through the same angle simultaneously. It should also be noted that a cluster of two or more beams can be rotated simultaneously. The resulting output after WBC is performed along the array dimension is shown in output front view 318 as a single emitter. Dispersive element 314 is shown as a reflection diffraction grating, but may also be a dispersive prism, a grism (prism+grating), transmission grating, and Echelle grating. This particular embodiment illustrated shows only four laser emitters; however, as discussed above this system could take advantage of a laser diode array that included many more elements, e.g., 49. This particular embodiment illustrated shows a single bar at a particular wavelength band (example at 976 nm) but in actual practice it can be composed of multiple bars, all at the same particular wavelength band, arranged side-by-side. Furthermore, multiple wavelength bands (example 976 nm, 915 nm, and 808 nm), with each band composing of multiple bars, can we combined in a single cavity. Because WBC was performed across the fast dimension of each beam it easier to design a system with a higher brightness (higher efficiency due to insensitivity due to bar imperfections); additionally, narrower bandwidth and higher power output are all achieved. As previously discussed it should noted some embodiments WBC system 300a may not include output coupler 316 and/or collimation lens(es) 306. Furthermore, pointing errors and smile errors are compensated for by combining along the stack dimension (In this embodiment this is also the fast dimension). FIG. 3B, shows an implementation similar to 3A except that a stack 350 of laser arrays 302 forms a 2-D input profile 312. Cavity 300b similarly consists of collimation lens(es) 306, optical rotator 305, transform optic 308, dispersive element 308 (here a diffraction grating), and an output coupler 316 with a partially reflecting surface. Each of the beams is individually rotated by optical rotator 305 to form an after rotator profile 307. The WBC dimension is along the array dimension, but with the rotation each of the beams will be combined across their fast axis. Fast axis WBC produces outputs with very narrow line widths and high spectral brightness. These are usually ideal for industrial applications such as welding. After transform optic 308 overlaps the rotated beams onto dispersive element 314 an single output profile is produced and partially reflected back through the cavity into the laser elements. The output profile 318 is now comprised of a line of three (3) beams that is quite asymmetric.

Figure 3C:
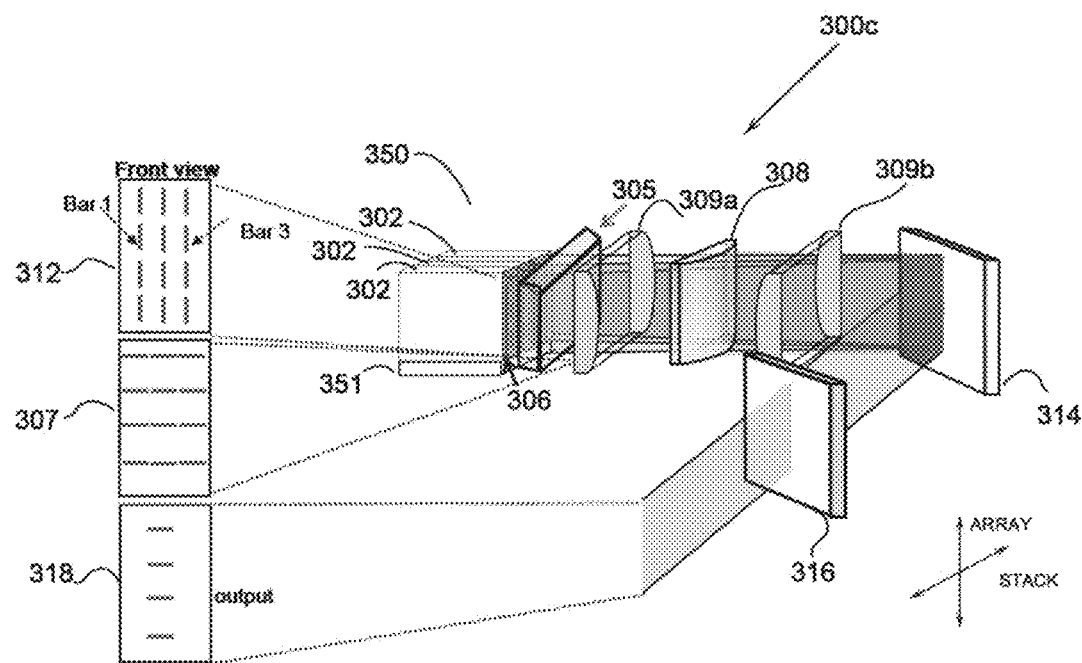
FIG. 3C is a schematic of a 1-D WBC system including an optical rotator selectively reorienting a two-dimensional array of beams.

FIG. 3C shows the same implementation when applied to 2-D laser elements. The system consists of 2-D laser elements 302, optical rotator 305, transform optical system (308 and 309a-b) a dispersive element 314, and a partially reflecting mirror 316. FIG. 3C illustrates a stack 350 of laser diode bars 302 with each bar having an optical rotator 305. Each of the diode bars 302 (three total) as shown in external cavity 300c includes four emitters. After input front view 312 is reoriented by optical rotator 305, reoriented front view 307 now the slow dimension of each beam aligned along the stack dimension. WBC is performed along the dimension, which is now the slow axis of each beam and the output front view 318 now comprises single column of beams with each beam's slow dimension oriented along the stack dimension. Optic 309a and 309b provide a cylindrical telescope to image along the array dimension. The function of the three cylindrical lenses are to provide two main functions. The middle cylindrical lens is the transform lens and its main function is to overlap all the beams onto the dispersive element. The two other cylindrical lenses 309a and 309b form an afocal cylindrical telescope along the non-beam combining dimension. Its main function is to make sure all laser elements along the non-beam combining are propagation normal to the partially reflecting mirror. As such the implementation as shown in FIG. 3C has the same advantages as the one shown in FIG. 1C. However, unlike the implementation as shown in FIG. 1C the output beam is not the same as the input beam. The number of emitters in the output beam 318 in FIG. 3C is the same as the number of bars in the stack. For example, if the 2-D laser source consists of a 3-bar stack with each bar composed of 49 emitters, then the output beam in FIG. 1C is a single bar with 49 emitters. However, in FIG. 3C the output beam is a single bar with only 3 emitters. Thus, the output beam quality or brightness is more than one order of magnitude higher. This brightness improvement is very significant for fiber-coupling. For higher power and brightness scaling multiple stacks can be arranged side-by-side.

To illustrate this configuration further, for example, assume WBC is to be performed of a 3-bar stack, with each bar comprising of 19 emitters. So far, there are three options. First, wavelength beam combining can be performed along the array dimension to generate 3 beams as shown in FIG. 1B. Second, wavelength beam combining can be performed along the stack dimension to generate 19 beams a shown FIG. 1C. Third, wavelength beam combining can be performed along the array dimension using beam rotator to generate 19 beams as shown FIG. 3C. There are various trade-offs for all three configuration. The first case gives the highest spatial brightness but the lowest spectral brightness. The second case gives the lowest spatial brightness with moderate spectral brightness and beam symetrization is not required to couple into a fiber. The third case gives the lowest spatial brightness but the highest spectral brightness and beam symmetrization is required to couple into an optical fiber. In some applications this more desirable.

Figure 3D:
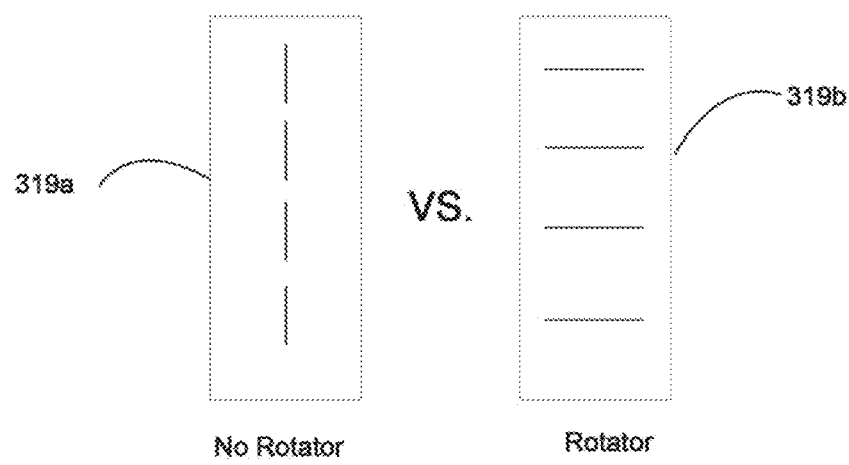
FIG. 3D illustrates output profile views of the system of FIG. 3c with and without an optical rotator.

To illustrate the reduction in asymmetry FIG. 3D has been drawn showing the final output profile 319a where the system of 300b did not have an optical rotator and output profile 319b where the system includes an optical rotator. Though these figures are not drawn to scale, they illustrate an advantage achieved by utilizing an optical rotator, in a system with this configuration where WBC is performed across the slow dimension of each beam. The shorter and wider 319b is more suitable for fiber coupling than the taller and slimmer 319a.

Figure 4A:
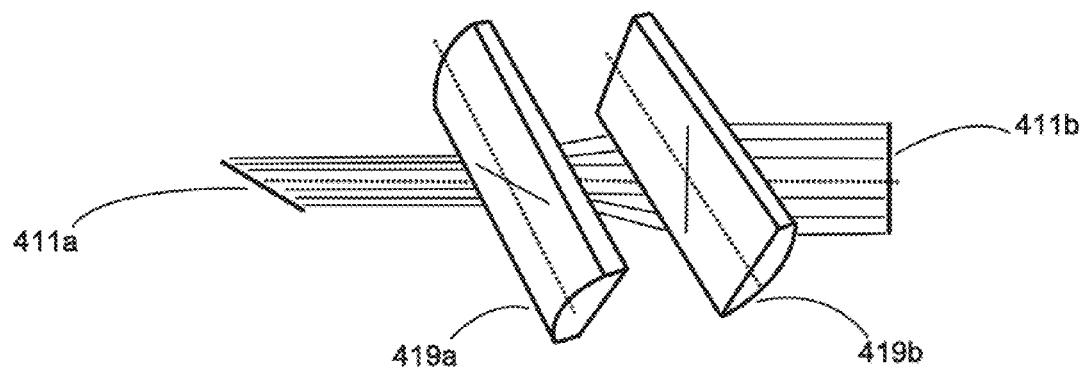
FIGS. 4A-C illustrate examples of optical rotators.
Figure 4B:
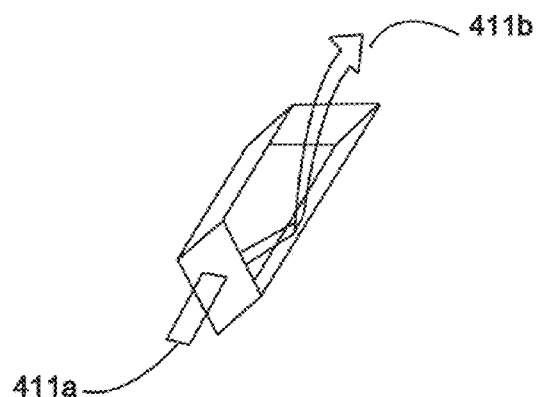
Figure 4C:
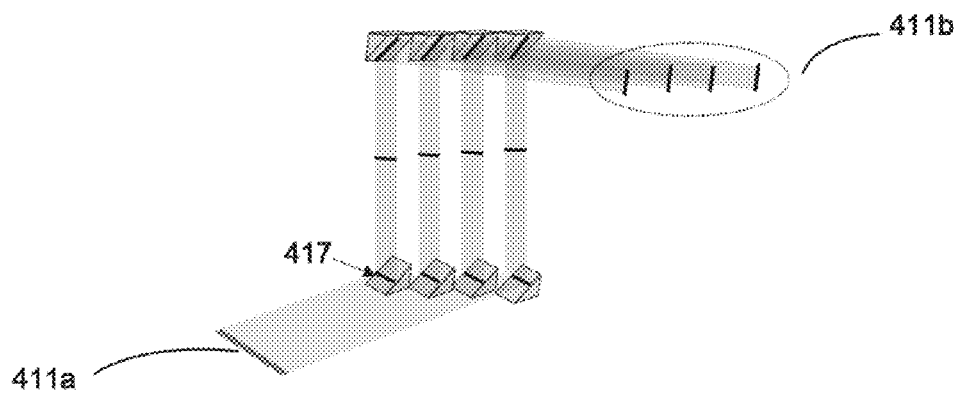

Example of various optical rotators are shown in FIG. 4A-C. FIG. 4A illustrates an array of cylindrical lenses (419a and 419b) that cause input beam 411a to be rotated to a new orientation at 411b. FIG. 4B similarly shows input 411a coming into the prism at an angle, which results in a new orientation or rotation beam 411b. FIG. 4C illustrates an embodiment using a set of step mirrors 417 to cause input 411a to rotate at an 80-90 degree angle with the other input beams resulting in a new alignment of the beams 411b where they are side by side along their respective fast axis. These devices and others may cause rotation through both non-polarization sensitive as well as polarization sensitive means. Many of these devices become more effective if the incoming beams are collimated in at least the fast dimension. It is also understand that the optical rotators can selectively rotate the beams at various including less than 90 degrees, 90 degrees and greater than 90 degrees.

The optical rotators in the previous embodiments may selectively rotate individual, rows or columns, and groups of beams. In some embodiments a set angle of rotation, such as a range of 80-90 degrees is applied to the entire profile or subset of the profile. In other instances, varying angles of rotation are applied uniquely to each beam, row, column or subset of the profile. (see FIGS. 9A-B) For instance, one beam may be rotated by 45 degrees in a clockwise direction while an adjacent beam is rotated 45 degrees in a counter-clockwise direction. It is also contemplated one beam is rotated 10 degrees and another is rotated 70 degrees. The flexibility the system provides can be applied to a variety of input profiles, which in turn helps determine how the output profile is to be formed.

Figure 9A:
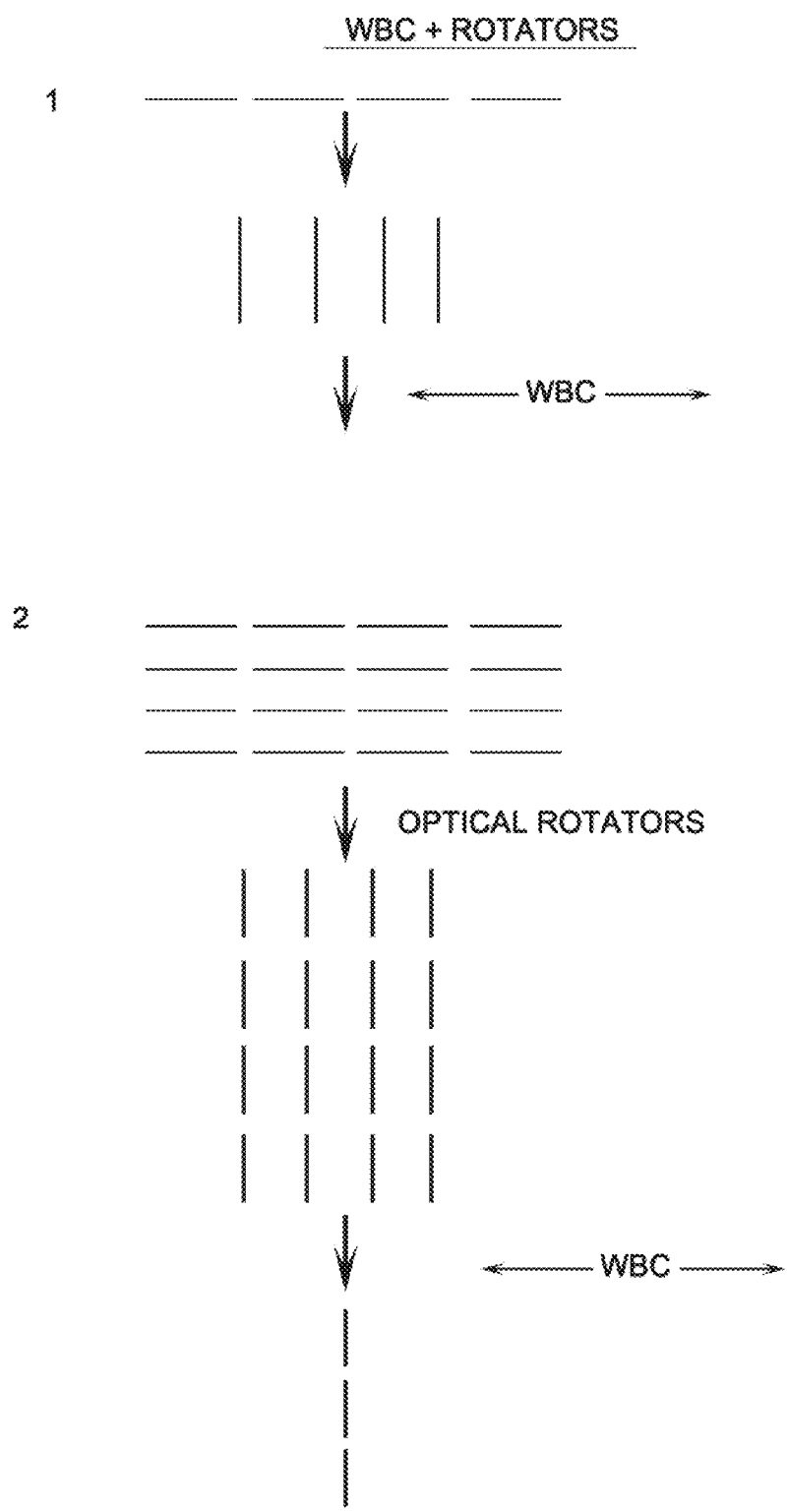
FIG. 9A illustrates embodiments using an optical rotator before WBC in both a single and stacked array configurations.
Figure 9B:
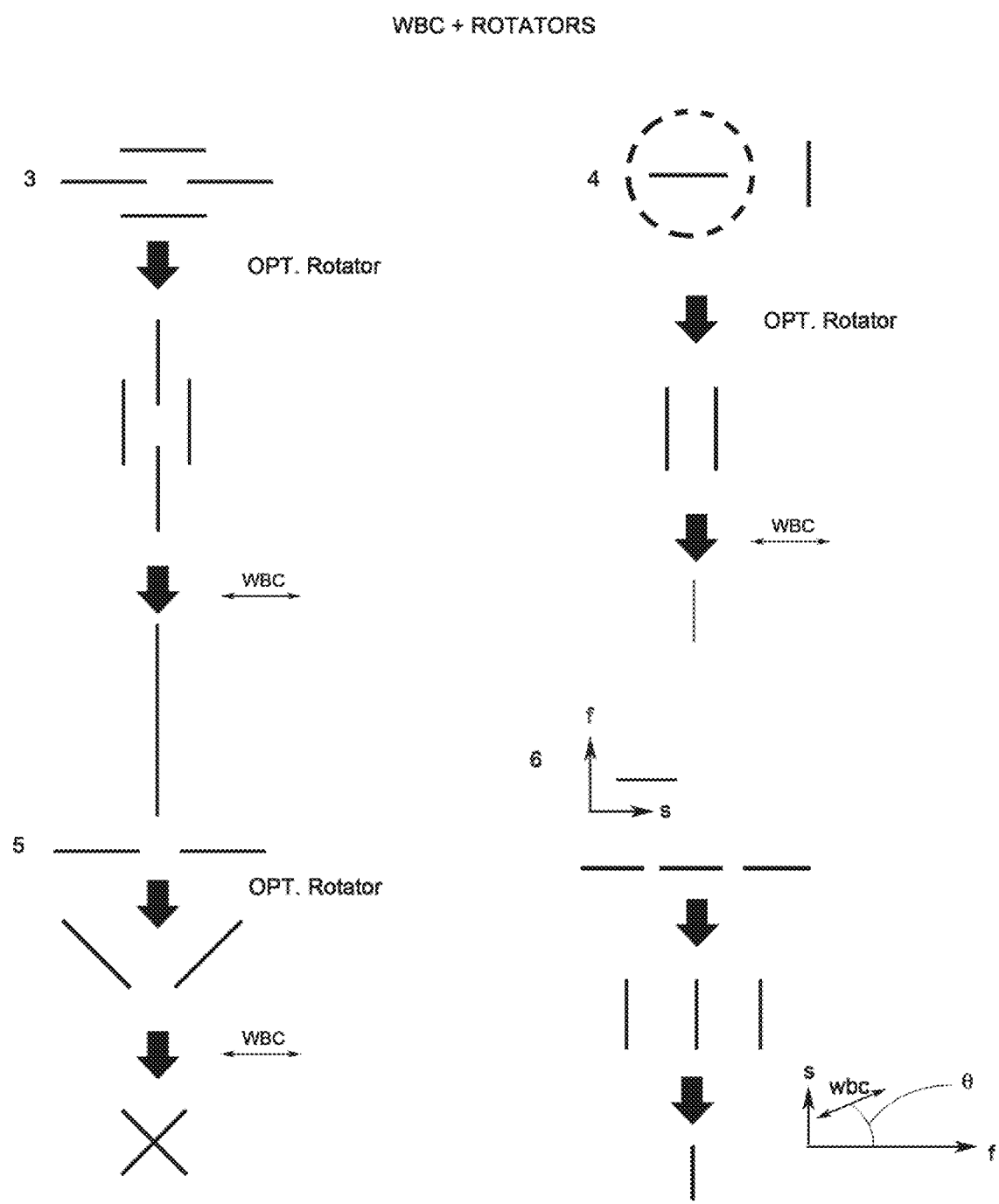
FIG. 9B illustrates additional embodiments using an optical rotator before WBC.

Performing WBC along an intermediate angle between the slow and fast dimension of the emitted beams is also well within the scope of the invention (See for example 6 on FIG. 9B). Some Laser elements as described herein, produce electromagnetic radiation and include an optical gain medium. When the radiation or beams exit the optical gain portion they generally are collimated along the slow and/or fast dimension through a series of micro lenses. From this point, the embodiments already described in this section included an optical rotator that selectively and rotated each beam prior to the beams being overlapped by a transform lens along either the slow or the fast dimension of each beam onto a dispersive element. The output coupler may or may not be coated to partially reflect the beams back into the system to the laser element where the returned beams assist in generating more external cavity feedback in the optical gain element portion until they are reflected off a fully reflective mirror in the back portion of the laser element. The location of the optical elements listed above and others not listed are with respect to the second partially reflective surface helps decide whether the optical elements are within an external cavity system or outside of the lasing cavity. In some embodiments, not shown, the second partially reflective mirror resides at the end of the optical gain elements and prior to the collimating or rotating optics.

Figure 6:
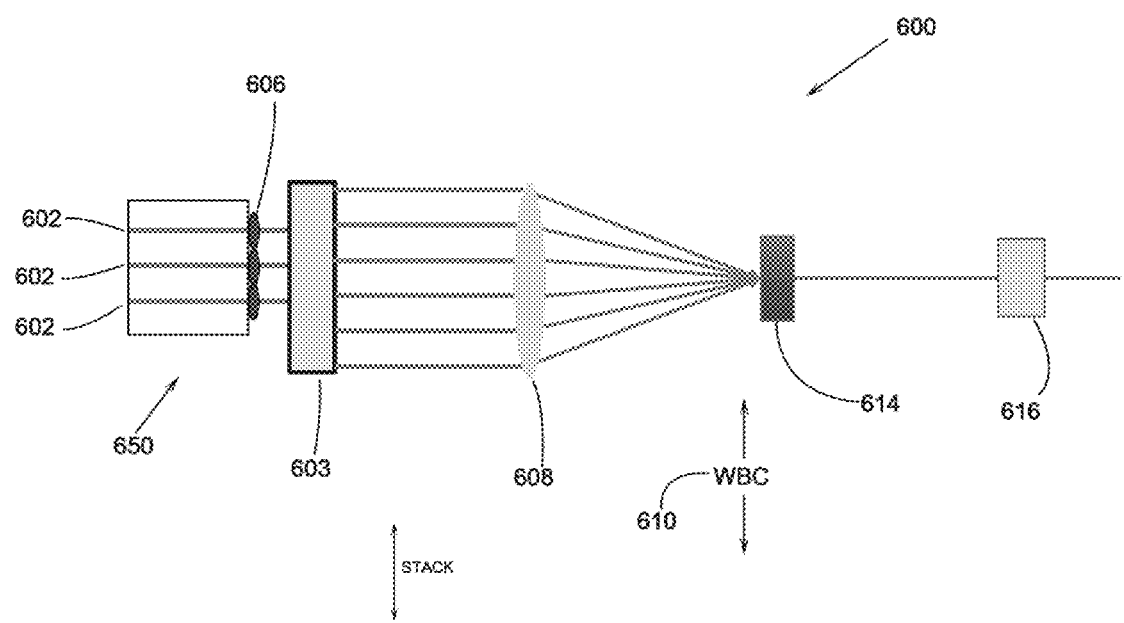
FIG. 6 illustrates a 1-D WBC embodiment having a spatial repositioning element.

Another method for manipulating beams and configurations to take advantage of the various WBC methods includes using a spatial repositioning element. This spatial repositioning element may be placed in an external cavity at a similar location as to that of an optical rotator. For example, FIG. 6 shows a spatial repositioning element 603 placed in the external cavity WBC system 600 after the collimating lenses 606 and before the transform optic(s) 608. The purpose of a spatial repositioning element is to reconfigure an array of elements into a new configuration. FIG. 6 shows a three-bar stack with N elements reconfigured to a six-bar stack with N/2 elements. Spatial repositioning is particularly useful in embodiments such as 600, where stack 650 is a mechanical stack or one where diode bar arrays 602 and their output beams were placed on top of each other either mechanically or optically. With this kind of configuration the laser elements have a fixed-position to one another. Using a spatial repositioning element can form a new configuration that is more ideal for WBC along the fast dimension. The new configuration makes the output profile more suitable for fiber coupling.

Figure 7:
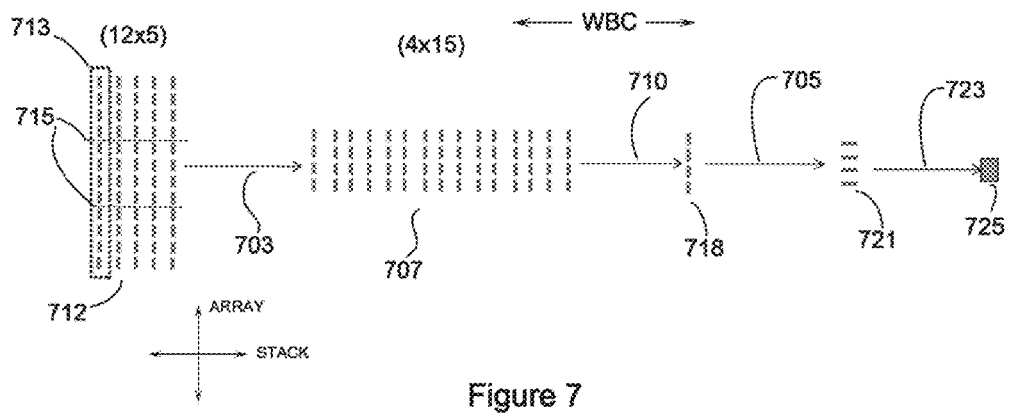
FIG. 7 illustrates an embodiment of a two-dimensional array of emitters being reconfigured before a WBC step and individual beam rotation after the WBC step.

For example, FIG. 7 illustrates an embodiment wherein a two-dimensional array of emitters 712 is reconfigured during a spatial repositioning step 703 by a spatial repositioning optical element such as an array of periscope mirrors. The reconfigured array shown by reconfigured front view 707 is now ready for a WBC step 710 to be performed across the WBC dimension, which here is the fast dimension of each element. The original two-dimensional profile in this example embodiment 700 is an array of 12 emitters tall and 5 emitters wide. After the array is transmitted or reflected by the spatial repositioning element a new array of 4 elements tall and 15 elements wide is produced. In both arrays the emitters are arranged such that the slow dimension of each is vertical while the fast dimension is horizontal. WBC is performed along the fast dimension which collapses the 15 columns of emitters in the second array into 1 column that is 4 emitters tall. This output is already more symmetrical than if WBC had been performed on the original array, which would have resulted in a single column 15 emitters tall. As shown, this new output may be further symmetrized by an individually rotating step 705 rotating each emitter by 90 degrees. In turn, a post WBC front view 721 is produced being the width of a single beam along the slow dimension and stacked 4 elements high, which is a more suitable for coupling into a fiber.

One way of reconfiguring the elements in a one-dimensional or two-dimensional profile is to make 'cuts' or break the profile into sections and realign each section accordingly. For example, in FIG. 7 two cuts 715 were made in 713. Each section was placed side by side to form 707. These optical cuts can be appreciated if we note the elements of 713 had a pre-arranged or fixed-position relationship. It is also well within the scope to imagine any number of cuts being made to reposition the initial input beam profile. Each of these sections may in addition to being placed side by side, but on top and even randomized if so desired.

Spatial repositioning elements may be comprised of a variety of optical elements including periscope optics that are polarized and non-polarized as well as other repositioning optics. Step mirrors as shown in FIG. 4a may also be reconfigured to become a spatial repositioning element.

It is contemplated spatial repositioning elements and optical rotators may be used in the same external-cavity system or a combination of inside and outside of the cavity system. The order of which element appears first is not as important and is generally determined by the desired output profile.

Additional embodiments encompassing, but not limiting the scope of the invention, are illustrated in FIGS. 9A-B. The system shown in 1 of FIG. 9A shows a single array of 4 beams aligned side to side along the slow dimension. An optical rotator individually rotates each beam. The beams are then combined along the fast dimension and are reduced to a single beam by WBC. In this arrangement it is important to note that the 4 beams could easily be 49 or more beams. It may also be noted that if some of the emitters are physically detached from the other emitters, the individual emitter may be mechanically rotated to be configured in an ideal profile. A mechanical rotator may be comprised of a variety of elements including friction sliders, locking bearings, tubes, and other mechanisms configured to rotate the laser element. Once a desired position is achieved the laser elements may then be fixed into place. It is also conceived that an automated rotating system that can adjust the beam profile depending on the desired profile may be implemented. This automated system may either mechanically reposition a laser or optical element or a new optical element may be inserted in and out of the system to change the output profile as desired.

System 2 shown in FIG. 9A, shows a two-dimensional array having 3 stacked arrays with 4 beams each aligned along the slow dimension. (Similar to FIG. 3C) As this stacked array passes through an optical rotator and WBC along the fast dimension a single column of 3 beams tall aligned top to bottom along the slow dimension is created. Again it is appreciated that if the three stacked arrays shown in this system had 50 elements, the same output profile would be created, albeit one that is brighter and has a higher output power.

System 3 in FIG. 9B, shows a diamond pattern of 4 beams wherein the beams are all substantially parallel to one another. This pattern may also be indicative of a random pattern. The beams are rotated and combined along the fast dimension, which results in a column of three beams aligned along the slow dimension from top to bottom. Missing elements of diode laser bars and stacks due to emitter failure or other reasons, is an example of System 3. System 4, illustrates a system where the beams are not aligned, but that one beam is rotated to be aligned with a second beam such that both beams are combined along the fast dimension forming a single beam. System 4, demonstrates a number of possibilities that expands WBC methods beyond using laser diode arrays. For instance, the input beams in System 4 could be from carbon dioxide ($CO_2$) lasers, semiconductor or diode lasers, diode pumped fiber lasers, lamp-pumped or diode-pumped solid state lasers and so forth. The ability to mix and match the type of lasers and wavelengths of lasers to be combined is another advantage encompassed within the scope of this invention.

System 5, illustrates a system where the beams are not rotated to be fully aligned with WBC dimension. The result is a hybrid output that maintains many of the advantages of WBC along the fast dimension. In several embodiments the beams are rotated a full 90 degrees to become aligned with WBC dimension, which has often been the same direction or dimension as the fast dimension. However, System 5 and again System 6 show that optical rotation of the beams as a whole (System 6) or individually (System 5) may be such that the fast dimension of one or more beams is at an angle theta or offset by a number of degrees with respect to the WBC dimension. A full 90 degree offset would align the WBC dimension with the slow dimension while a 45 degree offset would orient the WBC dimension at an angle halfway between the slow and fast dimension of a beam as these dimension are orthogonal to each other. In one embodiment, the WBC dimension has an angle theta at approximately 3 degrees off the fast dimension of a beam.

Compact Design

The next set of embodiments disclose methods and systems for scaling to multi-kW-class, extremely bright, wavelength-stabilized, fiber coupled diode laser systems that feature the following key attributes: compact design, reduced thermal mitigation, architecture based on user replaceable (plug and play) subcomponents, reduced cost of system, and schematics that allow for power scalability from hundreds of Watts to tens of kilowatts with near constant thermal loading. These laser systems may be referred to as a compact WBC laser system.

The compact WBC laser system described herein can be utilized in both fast axis wavelength beam combining and slow axis wavelength beam combining. These methods have been described in U.S. Pat. Nos. 6,192,062, 6,208,679 and US application 2010/0110556 A1 and are included herein for reference. Whether combining along the fast or slow axis of the radiation emitted by each of the emitters in an array, the compact WBC laser system offers a modular architecture for scaling to the kW- and multi-kW class. The basic building block or module includes a compact, low cost, and high spatial brightness fiber-couple diode laser.

Compact WBC Design

Figure 11A:
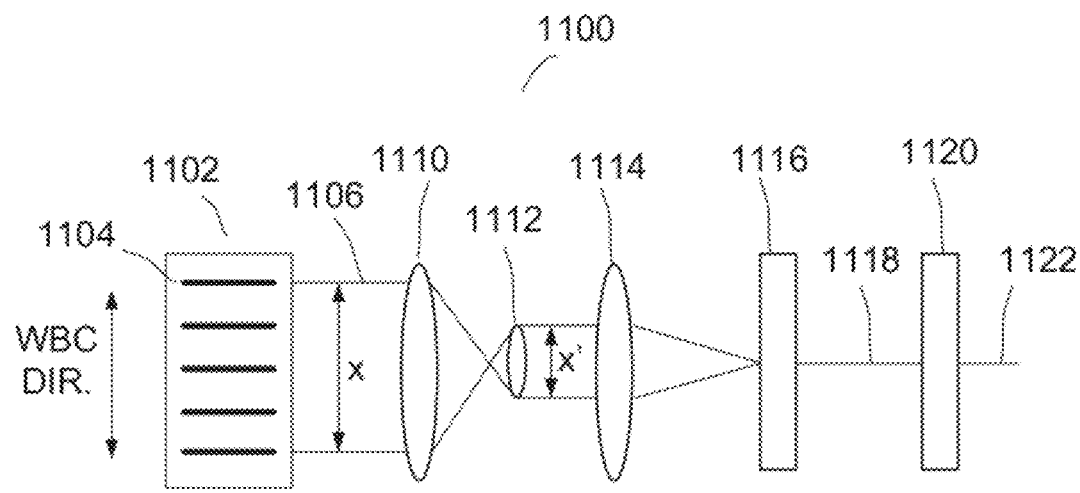
FIGS. 11A-B illustrate optical schematics of a compact WBC system from the beam combining and non-beam combining dimensions.
Figure 11B:
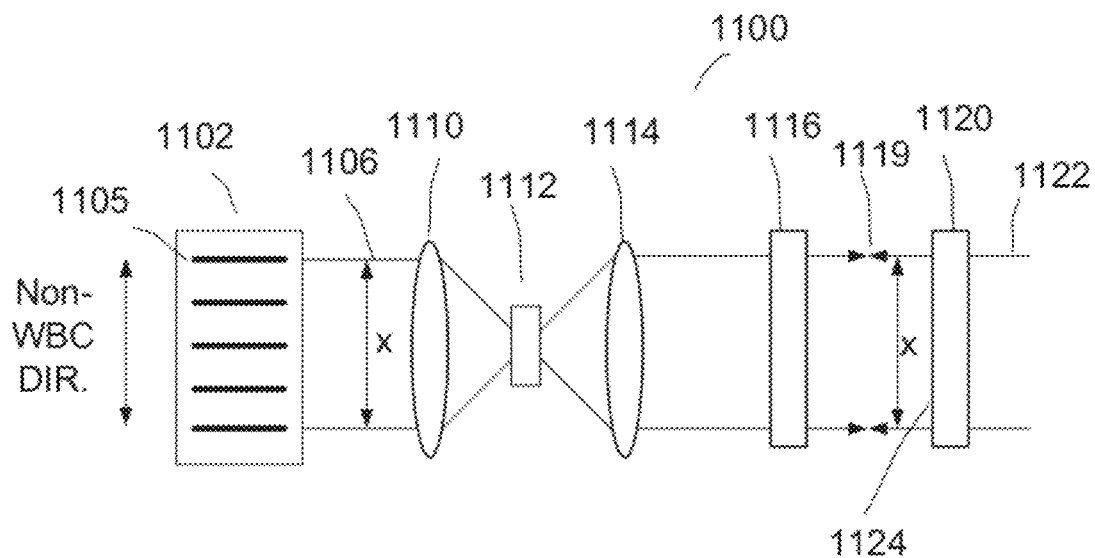

FIGS. 11A-B illustrate the basic architecture for a compact WBC system. The optical elements utilized in the compact WBC system are designed to reduce the overall length of the external cavity. These optical elements work interdependently which enables a more compact design. Previous basic WBC designs utilize a transform lens, diffraction grating, and an output coupler. As will be discussed below, the focal length of a transform lens used in previous WBC designs tends to be much larger than the focal length required public transform lens in a compact WBC design.

An optical schematic showing the wavelength beam combining direction of compact WBC system 1100 is shown in FIG. 11A. A stack of laser arrays 1102 produces a plurality of admission beams 1106. Included in the stack of laser arrays 1102 are individual laser arrays 1104 generally comprising a plurality of emitters. As previously discussed, these laser arrays may include a diode laser bar having 5, 10, 19 or more individual inventors. First optical element 1110 combines with second optical element 1112 to de-magnify the image produced by the plurality of emitters of laser stack array 1102 along the WBC direction. By making the beam of each array smaller, the demons will diverge more, and the larger diverging beams will be collimated along the WBC direction by a third optical element 1114, which functions as a transform lens to overlap the plurality of beams onto a dispersive element 1116.

Again, by de-magnifying each of the beams and then using optical element 1114 to collimate and overlap each beam on the dispersive element a larger beam size is created on the dispersive element, which reduces the potential of beam causing damage to the dispersive element. The overlapped beams 1118 are then transmitted to output coupler 1120. Output coupler 1120 is partially reflective. Some of the partially reflected light travels back through the system 1100 into each individual emitter. The dispersive element 1116 packs as a filter for the reflected light and as a result works to wavelength stabilize or lock each individual emitter at a unique wavelength.

Resonance in the system is formed between the back facets of each individual emitter and an effective output coupler with reflectivity that is a function of both the front facet and output coupler reflectivities. The front facet of each individual inventor may also be partially reflective and work in conjunction with the output coupler to form a wavelength stabilized cavity. The general guideline for the amount of reflectivity for partially-reflective surfaces is: in order to achieve optimal optical output power and wavelength tuning ranges of tens of nanometers then the output coupler should be about 10% reflective with a ratio of about 10 with the front facet which translates the front facet to having approximately 0.5% to 1% or lower. If the reflectivity of the front facet is increased then the reflectivity of the output coupler will also need be increased to achieve optimal tuning but it will do so at a lower efficiency.

Along the non-WBC direction of compact WBC 1100 illustrates additional interdependence of optical elements 1110 and 1114 functioning to image the admission beams 1106 along the non-WBC direction. Ideally optical elements 1110 and 1114 will image the admission beams 1106 at the partially reflective surface 1124 of the output coupler 1120. This is done to reduce optical losses. Optical elements 1110 and 1114 as shown are spherical lenses, however spherically curved mirrors or similar functioning optics may also be used, so long as they are configured to function interdependently work with each other. Optical element 1112 as shown is a cylindrical lens and likewise it is anticipated a cylindrically curved mirror or similar optic may be used. Summarily, the three optical elements 1110, 1112, and 1114 work interdependently to perform three main functions: 1) de-magnify the array of emitters along the WBC direction, 2) overlap the array of emitters along the WBC direction onto the dispersive element, and 3) image the array of emitters along the non-WBC direction. Though not shown, it should be noted that fast axis collimating lenses (FAC) may be placed at or near the front facet of each emitter. It should also be noted that each emitter includes an optical gain medium between its back in front facets.

Figure 12A:
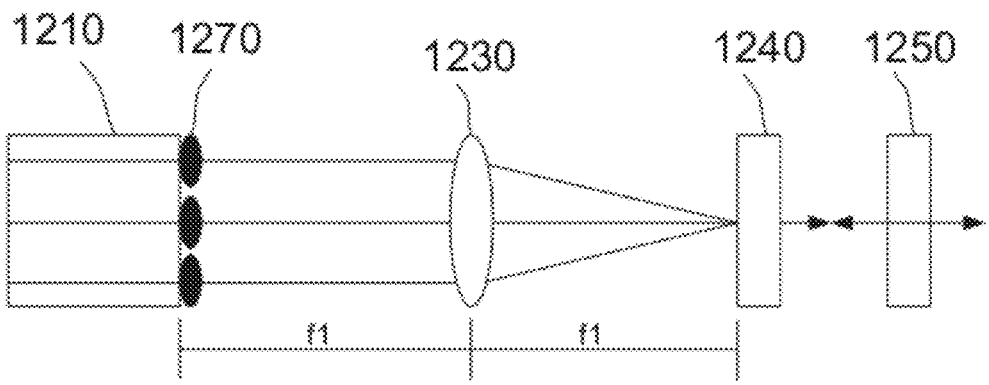
FIGS. 12A-B illustrate prior WBC optical schematics.
Figure 12B:
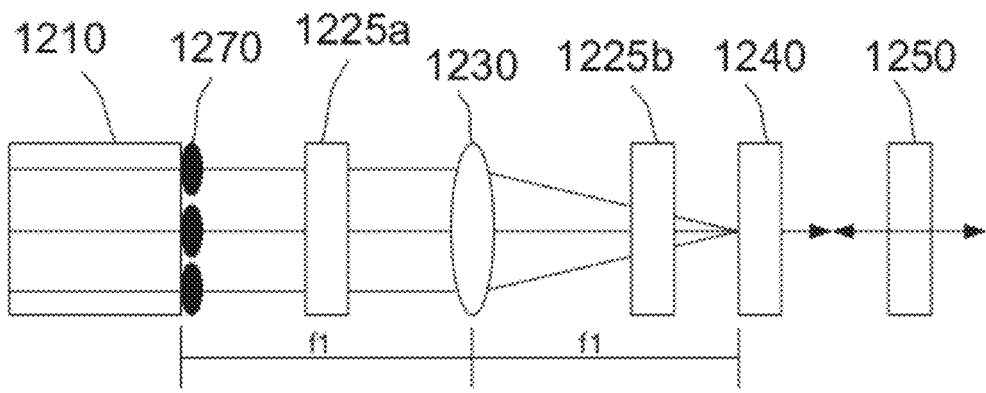

Previous WBC designs incorporate a transform lens, diffraction grating and output coupler in their basic design. Additionally, these previous designs use imaging optics and also anamorphic beam expanders or other optical elements to reduce beam size. However, the previous systems created do not use optical elements that interdependently function together. As a result, these designs do not benefit from a shorter or more compact resident cavity accomplished by the embodiments disclosed herein. To illustrate, FIGS. 12A-B show previous basic WBC designs. A stack of laser arrays 1210 has a plurality of fast axis collimating lenses 1270 placed at or near the front facet of the gain medium associated with each emitter. Transform lens 1230 is placed approximately a focal length away from the front facet of each emitter and another focal length away from dispersive element 1240. Thus, the resonant cavity has a length of at least 2×f1 as drawn. The transform lens 1230 then overlaps all the beams from each emitter onto the dispersive element 1240 to be transmitted through the partially-reflective output coupler 1250 as a combined output profile.

The design shown in FIG. 12A does not benefit from having been expanding optics as described above, nor does it have imaging optics. However, previous designs such as the one shown in FIG. 12B do include imaging optics 1225 *a* and 1225, but these imaging optics are not interdependently integrated with transform lens 1230. Similarly, some previous embodiments incorporate been expanding optics and just as the embodiment illustrated in FIG. 12B shows the independent functionality of each of the optical elements the same issue occurs with been expanding optics being independent of the other optical elements in a WBC laser system.

A simple example contrasting a compact WBC design from previous designs is as follows: When pumping a fiber laser at 976 nm the required spectral bandwidth is approximately 3 nm. Assuming a single diode bar having a near-field aperture of 10 mm, the required transform optic lens is approximately 1300 mm in focal length for use with a 1600 l/mm grating. Thus, the total length between the diode laser bar and grating is 2600 mm, which is calculated by adding the focal length between the diode bar to the transform lens to the focal length of the transform lens to the diffraction grating. By contrast, a compact WBC system using the same grating would replace the single transform optic lens with f=1300 mm with a 3-lens system consisting of f1=50 mm, f2=1 mm, and f3=26 mm for a total length of 154 mm, which is approximately 16 times shorter.

In the above example, imaging optics for traditional WBC systems were not mentioned, because the imaging optics do not always contribute to extending the length of the system. In practice, if the traditional WBC system in this example did include transform optics the number of optics used as compared to a compact WBC system would be essentially the same though the length would remain the same. However, if beam expanding optics were also included, the cavity may be shortened, but the number of optics used may actually exceed that of the compact WBC system. Thus, as illustrated a compact a WBC system allows for a more compact system using an optimal amount of optics to achieve the same functionality of previous WBC designs. Multiple benefits are derived from having a more compact system such as a small footprint, cost manufacturing, and ease of scalability.

Figure 13A:
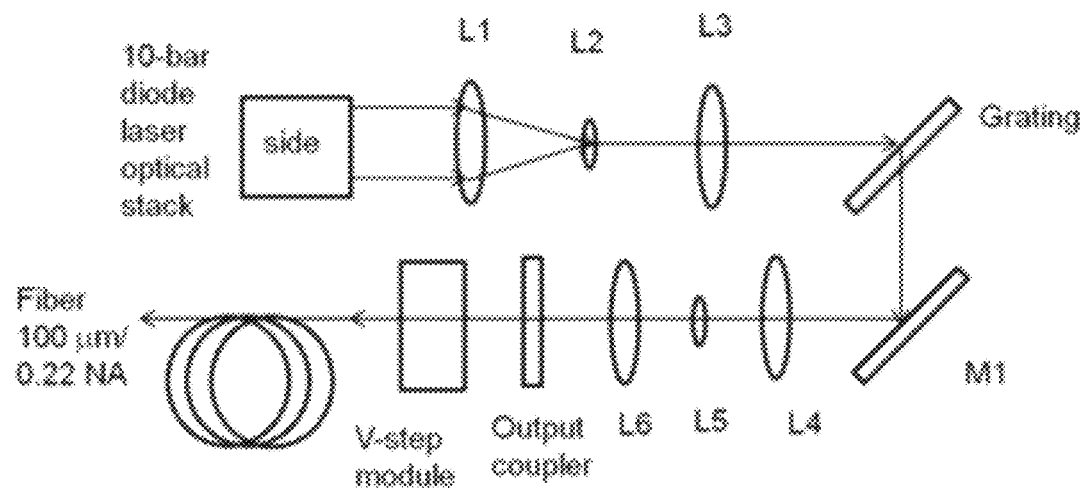
FIGS. 13A-B illustrate optical schematics of additional compact WBC laser systems.

In FIG. 13A, a schematic diagram of a fiber-coupled compact WBC laser based on fast-axis WBC is shown. This is an illustrative design, wherein similar designs with different parameters are also workable. The diode laser optical stack consists of ten (10) commercially available 976-nm diode laser bars. Each bar has 19 emitters and a nominal output power of 80 W. With L1, L2, L3, the grating, M1, L4, L5, L6, and the output coupler, we expect the output bandwidth is 2.0 nm, which is narrow enough for most fiber and solid-state pump applications. The function of L1, L2, and L3 are similar to the basic compact-WBC system wherein the three functions of 1) reducing (de-magnifying) image size, 2) overlapping beams in WBC dimension onto dispersive element and 3) image beam along non-WBC dimension. The imaging that takes place along the non-WBC dimension can place the plurality of emission beams at the front facet at any desirable location such as the output coupler to achieve efficient stabilization of the external cavity system. In some instances, additional manipulation of the multi-wavelength beam is needed for various applications. Here another image reducing step is desired after the dispersive (where the overlapping of enlarged collimated images of beam occur) to place the multi-wavelength to be used with the V-step module. Thus, L4, L5, and L6 again perform similar functions as L1-3 insofar as they de-magnify along the WBC dimension and reimage along the non-WBC dimension. Using a commercially available V-step module, the output beam can be coupled to a 100 μm/0.22 NA fiber. The V-Step module permits an emitter array to be coupled efficiently to multimode fibers by transforming the unsymmetrical beams from the emitters in fast and slow-axis into a symmetrical profile with the same level of divergence in both directions of propagation. The estimated fiber-coupled power is approximately 500 W where polarization multiplexing is not required. If a kW-class fiber combiner is used, the output fiber of four modular compact WBC lasers can be combined to generate 2000 W coupled to a 200 µm/0.22 NA fiber. As improved diode lasers become available in the future, higher power levels and brightness levels can be achieved using similar approaches. This scheme is enabled by the commercial availability of high quality passively cooled diode laser bars with low smile and pointing error.

Architecturally, there are generally two different cavity design setups for WBC systems. The first as discussed, comprises stacking multiple diode bars having a plurality of emitters on top of each other. This stacking of an array of emitters creates a two-dimensional profile. The second design comprises aligning a plurality of diode bars having multiple emitters side-by-side. Configuring a side-by-side array of diode bars is generally an easier configuration to manufacture. By incorporating optical spatial repositioning elements that individually rotate each emitter with respect to their fast axis, a side-by-side configuration may now take advantage of utilizing fast axis WBC. Thus, creating a profile approximately the same width of an individual emitter having high brightness. Furthermore, when combining a side-by-side configuration with the set up of a compact WBC design allows for a high brightness laser system to be produced in a small footprint.

If we assume 500 W is the baseline power per module. 500 W is assumed mainly due to thermal loading considerations on the optical elements. Seven of these modules can be bundled into a single 300/0.22 fiber with a total power level of 3500 W. by creating compact WBC modules with relatively low thermal loading and management concerns a multi-kilowatt system can be produced that allows for less complex optical components, thermal management system, and footprint.

Figure 13B:
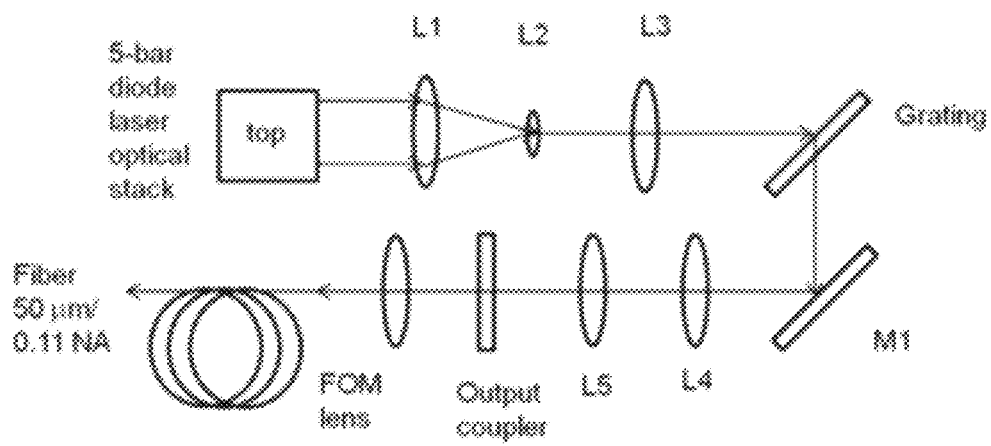

In FIG. 13B, illustrates another schematic of a fiber-coupled compact-WBC laser based on slow axis WBC. This is a sample design, and similar designs with different parameters are workable. The diode laser optical stack consists of five (5) commercially available 976-nm diode laser bars. Each bar has 19 emitters and a nominal output power of 80 W. With L1, L2, L3, the grating, M1, L4, L5, and the output coupler, we expect the output bandwidth is 7.8 nm. L4 and L5 are used for imaging the slow-axis. In this design beam de-magnification along the WBC dimension is not needed. L4 and L5 are not always needed either as L1-3 often manages the imaging, however, in this embodiment it showing a second or third set of imaging optics may used with the interdependent optical elements L1-L3. Owing to the high spatial brightness (WBC is performed along the length of each bar), the output beam, which is effectively the same as that of five single elements, can be coupled to a 50 µm/0.11 NA fiber using a simple fiber optical module (FOM) lens. The estimated fiber-coupled power is 250 W and by using polarization multiplexing, 500 W is possible from the same fiber. If a kW-class fiber combiner is used, the output fiber of seven compact-WBC lasers can be combined to generate 3500 W coupled to a 153 µm/0.11 NA fiber A 500 W fiber-coupled module as described in this section can fit within a footprint the area of a standard sheet of office paper (8.5"×11"). This is a very compact and modular fiber-coupled laser. As improved diode lasers are available in the future, even higher power levels and brightness levels can be achieved using similar approaches. This scheme is enabled by the commercial availability of high quality passively cooled diode laser bars with low smile and pointing error.

It is important to emphasize that there are two very important technical innovations that enable all of these Compact WBC laser architectures, particularly the ones based on Old WBC. The first innovation is the availability of extremely low smile single diode laser bars. The second innovation is utilizing a folding or turning mirror to compensate for each diode laser bar that emits having angle off of the optical axis. This results in the effective pointing error of each bar to be zero, since any residual pointing error resulting from the bar mounting and lensing process can be compensated for by the folding mirror. Schematically this is illustrated in FIGS. 14A-B.

Figure 14A:
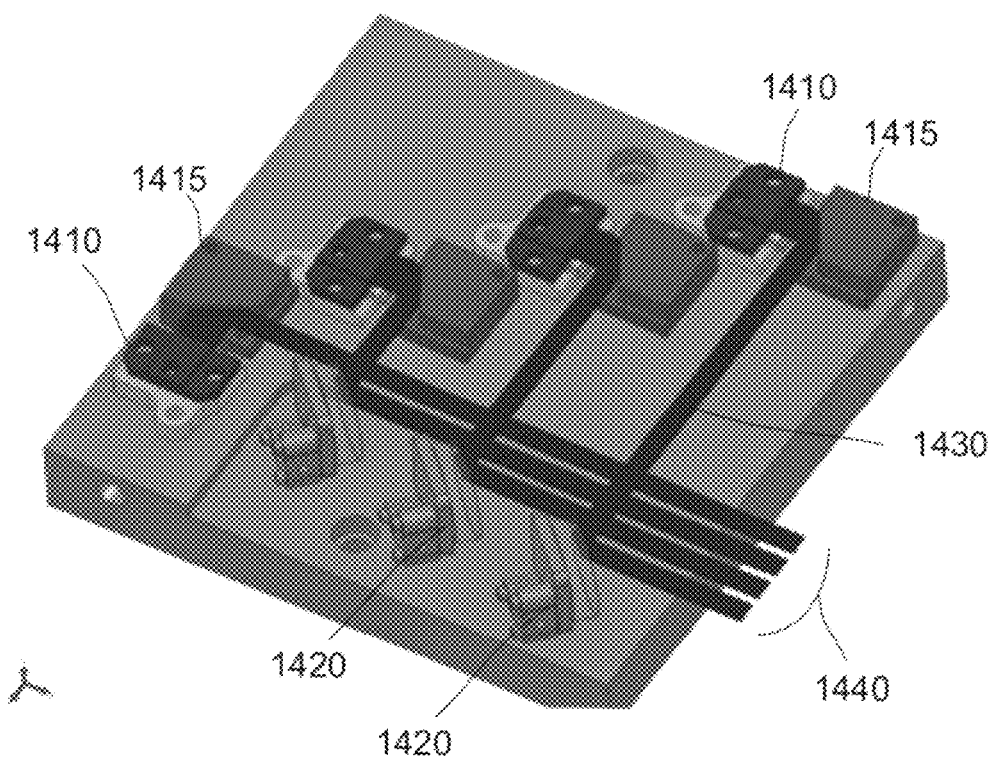
FIGS. 14A-B illustrate various embodiments arranging multiple diode bars using turning mirrors for a WBC system for one and two-dimensional arrays.

FIG. 14A illustrates a side-by-side configuration of multiple diode bar arrays 1410 being aligned along the same plane. As illustrated folding mirrors 1420 guide the emission 1430 of each diode bar 1410 to form an optical array 1440. This particular configuration also utilizes spatial rotating elements 1415. Elements 1415 individually rotate each admitted being approximately 90°, so that the optical array 1440 may be combined using WBC along the fast axis of each emitter. In this configuration each diode bar has 19 emitters. The resulting output beam after being combined will effectively create the power of 4×19 emitters into the space of the size of a single emitter, thus creating a high brightness laser. This output can also be easily coupled into a 50 µm fiber. It should also be noted that only three folding mirrors were required to align the diode bars with a single reference diode bar.

Figure 14B:
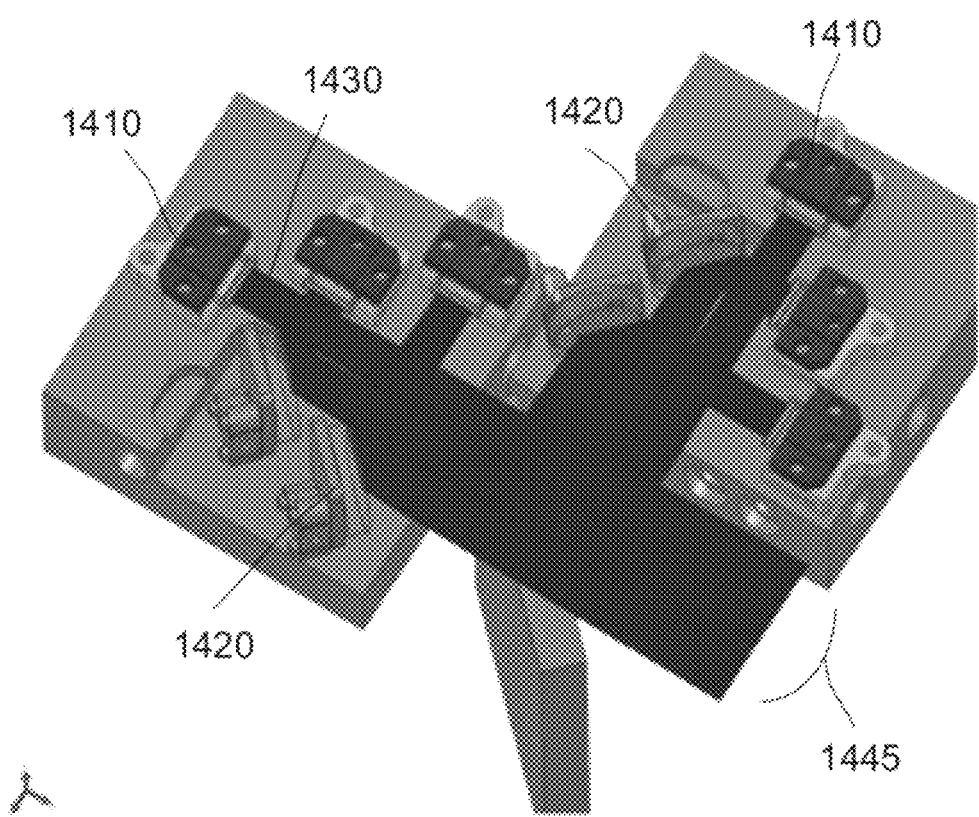

Alternatively, a two-dimensional array can also be produced utilizing folding mirrors as illustrated in FIG. 14B. As shown, the emission 1430 from each six diode bars 1410 are combined using folding mirrors 1420 to create a 3×2 optical arrangement. Unlike the previous example (FIG. 14A), there are no beam twisters used to create optical stack 1445. The optical stack 1445 arrangement is equivalent to a diode laser stack consisting of two bars, each with 57 (19×3) individual emitting elements. The turning mirrors 1420 as illustrated provide for full compensation of the pointing error. When used in combination with an external cavity based on slow-axis WBC, the output beam results in an effective stack of two single emitters. This effective output consisting of two single emitters has high brightness and can also be coupled to a 50 micron fiber. If WBC is performed along the fast axis of each emitter the resulting output beam is that of a single 57-emitter bar. In this case the spatial brightness enhancement is only a factor of two times.

The Compact WBC approach also lends itself well to accommodating lower quality diode laser bars and diode laser emitters. This applies particularly to the approaches based on fast-axis WBC. For example, these lower quality bars may have larger bar smile or pointing error, and may have a lower cost as compared with higher quality bars. For bars utilizing optical rotators in combination with fast-axis WBC the output beam is that of a single element. Smile and pointing error will generally result in a slight degradation of beam quality, but because there is considerable margin in fiber coupling a single emitter (with ideal $M^2=1\times7$ or better) to a 50 micron fiber (with $M^2=9\times9$), the design is extremely tolerant to beam quality defects in diode laser sources.

Thermal mitigation and management is generally a challenge in high power laser systems. Due to thermal loading in the gain medium, bulk solid state diffraction-limited beam quality is generally limited to the hundred-Watt class. To get better performance from bulk solid state lasers extremely aggressive thermal mitigation is required. Two popular methods are: (1) running the laser at cryogenic temperature (T~77 K), and (2) switching from the rod geometry (approximately centimeter-sized rods) to the thin-disk geometry (using disks approximately 100 microns thick). Even with these aggressive methods diffraction-limited output is limited to the kW-class. While kW-class diffraction-limited can be obtained with these two methods, the complexity and cost of these systems are dramatically increased.

Another important attribute of the compact WBC laser system is the system may be modularized subcomponents and entirely user replaceable. Compact WBC systems may be designed to be modular, allowing for 1) scalability by adding additional modules and 2) replaceable by swapping about a damaged module with a new module. By designing a modular system the need for expensive servicing, downtime and hours spent swapping out modules becomes simpler as each module is built on a 'plug and play' scheme. As discussed further below, the output of each compact WBC lasers may be coupled into a fiber, thereby only needing to replace a portion of the total source as opposed to the entire source.

As mentioned, another attribute of the compact WBC system is simplified power scaling, without thermal concerns, from hundreds of Watts to tens of kW. With each module managing the individual thermal concerns and combining the output power of each either through fiber coupling, dichroic mirrors, a combination thereof and other combining techniques discussed below a robust high power system with minimal thermal management concerns may be achieved.

Scaling to Higher Power

Figure 15:
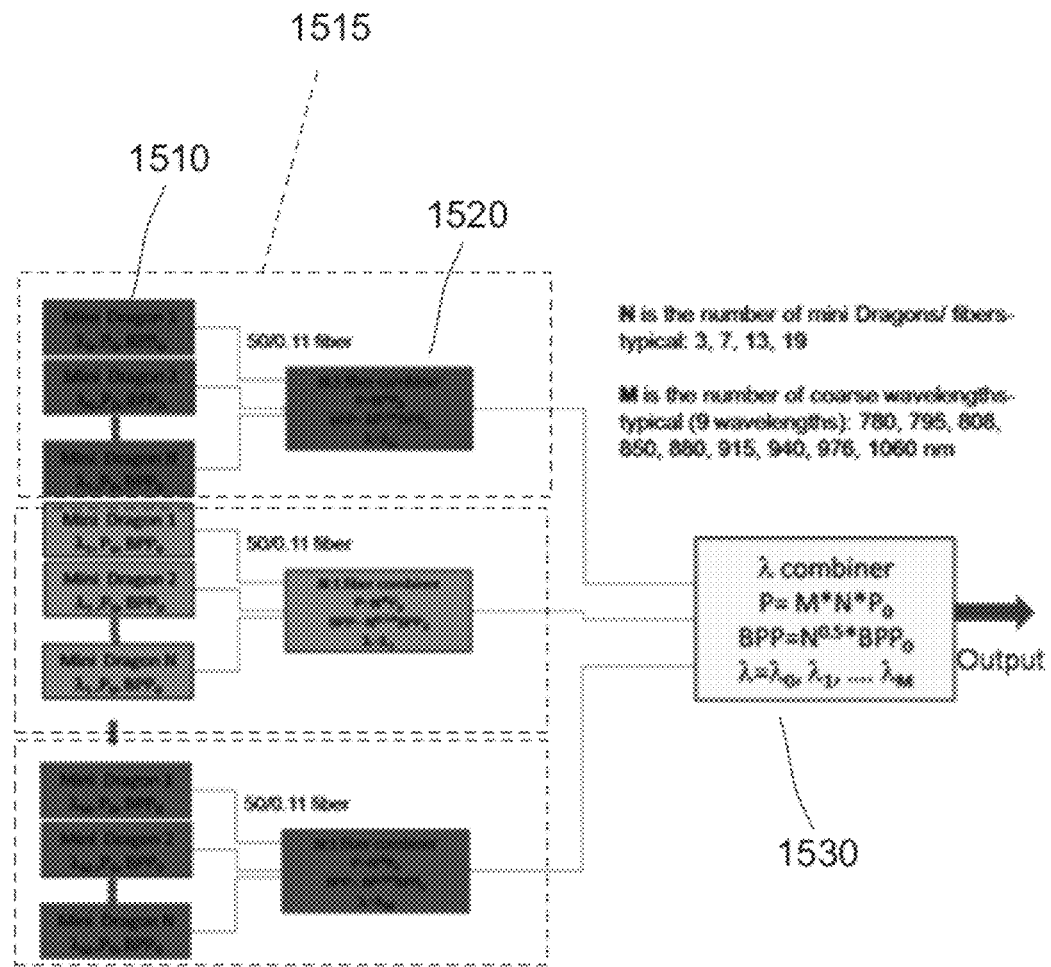
FIG. 15 illustrates the fundamental architecture for scaling multiple compact WBC systems having higher power and brightness

As noted in previous sections, a kW-class fiber combiner can be used to scale the output power from the Compact-WBC lasers described. In this section we give further details about the implementation of fiber combining. FIG. 15 shows the fundamental architecture for scaling to higher power and brightness. For purposes of this illustration the fundamental building block here is called a Mini Dragon laser, and consists of a compact-WBC embodiment. Each Mini Dragon laser has output power $P_0$, with output beam quality (beam parameter product) $BPP_0$, and operating at wavelength $\lambda_M$. Here we assume for simplicity that each module has the same power and beam quality. We also assume that each module can operate at any of the commercially available diode laser wavelengths (e.g., from 780 nm to 1060 nm). As indicated in FIG. 15 we assume each module is fiber coupled to a 50 µm/0.11 NA fiber but essentially any fiber, smaller or larger in core diameter or in NA, is workable. In FIG. 15 each section encompassed by a broken lined box 1515 represents a wavelength band. In this architecture, modules 1510 at a unique center wavelength are first fiber-bundled together to generate a higher power system 1520. Then multiple fiber-bundled outputs 1520, each at a different wavelength, are coarse wavelength division multiplexed (WDM) 1530 for further increase in output power.

In table 1 below, are examples of common types of fiber bundles. For the purposes of FIG. 15 we are assuming each module 1510 is a 500 W unit coupled into a 50/0.11 fiber. The beam parameter product for such module is 2.75 mm-mrad. Some of the most common fiber bundles are 7 to 1, 13 to 1, and 19 to 1. Here, for example, 7 to 1 means seven (7) 50/0.11 fibers are bundled and fused into a single fiber. Assuming a typical 25% degradation in brightness a 7×50/0.11 fiber bundle results in a single fiber with the same numerical aperture with diameter of 153 microns. The resulting BPP is approximately 8.4 mm-mrad. The output power from such a system is 3,500 W. Using a 19 to 1 bundle nearly 10 kW can be achieved. The bundled fibers are usually tapered and fused together to make a single output fiber as known in the art.

Table 1 below lists various fiber bundles and their respective parameters:

| Fiber | Output Fiber Bundle (µm)/NA | BPP (mm.mrd) | Power (W) |
|---|---|---|---|
| 1:1 | 50/0.11 | 2.75 | 500 |
| 7:1 | 153/0.11 | 8.4 | 3,500 |
| 13:1 | 208/0.11 | 11.4 | 6,500 |
| 19:1 | 252/0.11 | 13.9 | 9,500 |

Figure 16:
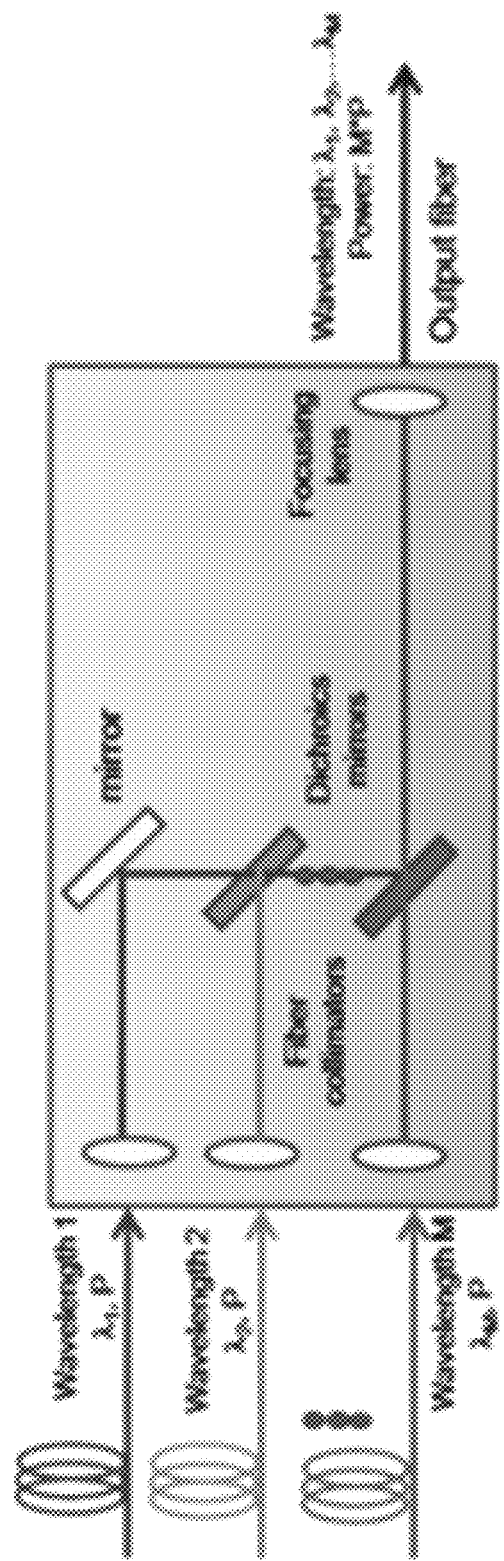
FIG. 16 illustrates a basic architecture of using dichroic mirrors to combine multiple wavelengths.

For scaling to higher power and brightness than can be achieved with a single center wavelength, the multiple bundled fibers can be wavelength multiplexed using conventional coarse wavelength combining. For instance, the system illustrated in FIG. 15, comprises nine total coarse wavelengths: 780, 795, 808, 850, 880, 915, 940, 976, and 1060 nm. Diode lasers at these wavelengths are well developed. One methodology of combining these coarse wavelengths uses dichroic mirrors. FIG. 16 shows a basic architecture of using dichroic mirrors to combine wavelengths. The output of each bundled fiber, with each bundle operating at a unique wavelength, is attached to a wavelength multiplexer. Each fiber is collimated by a fiber collimator. The function of the collimating lens and focusing lens is to image each input fiber to the output fiber. The architecture is the same as the N:1 fiber splitter for power and energy sharing that is currently commercially available. Table 2 shows output fiber, BPP, and power when 9 wavelengths are used. For simplicity we assume no brightness loss in fiber-to-fiber coupling.

TABLE 2

Fiber bundle using up to 9 coarse wavelengths.

| Fiber | Output Fiber Bundle (µm)/NA | BPP (mm · mrd) | Power (W) |
|---|---|---|---|
| 1:1 | 50/0.11 | 2.75 | 4,500 |
| 7:1 | 153/0.11 | 8.4 | 31,500 |
| 13:1 | 208/0.11 | 11.4 | 58,500 |
| 19:1 | 252/0.11 | 13.9 | 85,500 |

By using a plurality of compact WBC modules that are fiber coupled, into fiber combiners with connectorized or detachable fibers a simple replaceable and upgradeable system is achieved. In particular, this allows for less specialized in-filed training to swap out or upgrade systems.

To reiterate, by reducing the footprint of the WBC system through interdependent optical elements, a simpler thermal management system for both optical elements and the system as a whole is generated. With each module having a simple thermal management, scaling power becomes easier. Whereas, in other WBC designs, key optical elements are required for the scaling process and as a result become expensive and difficult to manufacture. The complexity of the thermal management system also increases.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A laser system comprising:
   A plurality of electromagnetic radiation sources each configured to produce a unique wavelength emission beam;
   a first and second optical element configured to collectively reduce the image size of the array of emission beams along a first dimension;
   a third optical element configured to receive the reduced-in-image size emission beams and overlap the beams along the first dimension;
   a dispersive element positioned at a region of overlap to receive and transmit the overlapped beams as a multi-wavelength beam; and
   a partially-reflective output coupler arranged to receive the multi-wavelength beam, to reflect a portion of the multi-wavelength beam back to the dispersive element, and to transmit the multi-wavelength beam,
   wherein the first and third optical elements collectively are configured to image the array of emission beams along a second dimension.

2. The laser system of claim 1, wherein the second dimension is orthogonal to the first dimension.

3. The laser system of claim 1, wherein each of optical elements may be comprised of a reflective mirror.

4. The laser system of claim 1, wherein the plurality of electromagnetic radiation sources are aligned along the slow-diverging axis of each emission beam.

5. The laser system of claim 4, wherein the first dimension is along the slow-diverging axis of the aligned electromagnetic radiation sources.

6. The laser system of claim 1, further including at least one turning mirror positioned between at least one electromagnetic radiation source and the first optical element, wherein the turning mirror is configured to align the at least one radiation source to form an array with the other electromagnetic radiation source(s).

7. The laser system of claim 1, further including an optical rotator positioned between the electromagnetic radiation sources and the first optical element, wherein the optical rotator is configured to optically rotate each of the emission beams about their respective slow-diverging axis.

8. The laser system of claim 1, further including a spatial repositioning element positioned between the electromagnetic radiation sources and the first optical element, wherein the spatial repositioning element is configured to optically arrange the emission beams in an array.

9. The laser system of claim 8, wherein the array is two-dimensional.

10. The laser system of claim 1, wherein the overall footprint is configured to fit within an 8.5"×11" area.

11. The laser system of claim 1, wherein the power output is 500 watts.

12. The laser system of claim 1, having a BPP less than 20.

13. A scalable laser system comprising:
   a plurality of laser modules, wherein each including:
      a plurality of electromagnetic radiation sources each configured to produce a unique wavelength emission beam,
      a first and second optical element configured to collectively reduce the image size of the array of emission beams along a first dimension,
      a third optical element configured to receive the reduced-in-image size emission beams and overlap the beams along the first dimension,
      a dispersive element positioned at a region of overlap to receive and transmit the overlapped beams as a multi-wavelength beam, and
      a partially-reflective output coupler arranged to receive the multi-wavelength beam, to reflect a portion of the multi-wavelength beam back to the dispersive element, and to transmit the multi-wavelength beam,
      wherein the first and third optical elements collectively are configured to image the array of emission beams along a second dimension, and
   wherein each module is optically combined using an optical fiber bundle.

14. The scalable laser system of claim 13, wherein each laser module produces at least 500 Watts of power.

* * * * *